(12) United States Patent  
Ishii et al.

(10) Patent No.: US 9,238,245 B2
(45) Date of Patent: Jan. 19, 2016

(54) COATING APPARATUS AND METHOD FOR FILLING COATING LIQUID

(71) Applicant: Tokyo Electron Limited, Tokyo (JP)

(72) Inventors: Takayuki Ishii, Kumamoto (JP); Kimio Motoda, Kumamoto (JP); Takashi Terada, Kumamoto (JP); Atsushi Yamashita, Kumamoto (JP); Shigeto Tsuruta, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 203 days.

(21) Appl. No.: 13/921,286

(22) Filed: Jun. 19, 2013

(65) Prior Publication Data

US 2014/0000518 A1    Jan. 2, 2014

(30) Foreign Application Priority Data

Jun. 27, 2012   (JP) .................................. 2012-144754

(51) Int. Cl.
*B05C 5/02*       (2006.01)
*H01L 21/67*      (2006.01)

(52) U.S. Cl.
CPC ............. *B05C 5/0258* (2013.01); *B05C 5/0254* (2013.01); *H01L 21/6715* (2013.01); *Y10T 137/0318* (2015.04)

(58) Field of Classification Search
None
See application file for complete search history.

(56) References Cited

U.S. PATENT DOCUMENTS 6,514,343 B1 *   2/2003   Motoda .......................... 118/323

FOREIGN PATENT DOCUMENTS

JP         08-103710    *   4/1996    ................ B05C 5/00
JP         08-173875 A       7/1996

* cited by examiner

*Primary Examiner* — Dah-Wei D Yuan
*Assistant Examiner* — Jethro M Pence
(74) *Attorney, Agent, or Firm* — Abelman, Frayne & Schwab

(57) ABSTRACT

A coating apparatus includes a nozzle, a moving mechanism, a pressure adjusting unit and a pressure control unit. The nozzle is provided with a storage chamber and a slit-like flow path, and configured to discharge the coating liquid from a discharge port formed at a front end of the flow path. The moving mechanism moves the nozzle and a substrate relatively to each other along the surface of the substrate. The pressure adjusting unit adjusts the pressure inside the storage chamber. The pressure control unit controls the pressure adjusting unit so as to adjust pressure inside the storage chamber. The pressure control unit controls the pressure adjusting unit such that the inside of the storage chamber becomes a negative pressure, and fills the coating liquid inside the storage chamber while slowly decreasing the negative pressure inside the storage chamber.

10 Claims, 15 Drawing Sheets

| | | Pressure |
|---|---|---|
| Storage chamber S | Small chamber Sa | High |
| | Small chamber Sb | Low |
| | Small chamber Sc | High |

# COATING APPARATUS AND METHOD FOR FILLING COATING LIQUID

CROSS-REFERENCE TO RELATED APPLICATIONS

This application is based on and claims priority from Japanese Patent Application No. 2012-144754, filed on Jun. 27, 2012 with the Japan Patent Office, the disclosure of which is incorporated herein in its entirety by reference.

TECHNICAL FIELD

The present disclosure relates to a coating apparatus and a method for filling coating liquid.

BACKGROUND

Conventionally, a spin coating method has been known as a method for coating a coating liquid on a substrate such as a semiconductor wafer or a glass substrate. The spin coating method refers to a method of spreading a coating liquid by dropping the coating liquid from a nozzle to a center of a substrate while rotating the substrate so that the coating liquid is diffused on the substrate by centrifugal force and spread to be coated on the substrate to form a coating film.

In such a spin coating method, the utilization efficiency is low because most of the dropped coating liquid is scattered out of the substrate. Thus, a slit coating method has recently been suggested as a coating method to replace the spin coating method.

The slit coating method refers to a method of coating using a nozzle having a slit-like discharge port. Specifically, in the slit coating method, a coating liquid, which is slightly exposed from the discharge port, is brought into contact with a substrate, and in this state, the nozzle and the substrate are relatively moved such that the coating liquid is spread on the substrate to form a coating film. According to this slit coating method, the utilization efficiency may be enhanced because it is possible to coat a coating liquid as needed on the substrate. See, e.g., Japanese Patent Laid-Open No. H8-173875.

Further, the nozzle disclosed in Japanese Patent Laid-Open No. H8-173875 is provided with a storage space configured to store the coating liquid. The nozzle discharges the coating liquid filled in the storage space from a discharge port through a slit-like path. A coating liquid supply system is connected to the storage space, and thus, the coating liquid is supplied from the coating liquid supply system such that the storage space is filled with the coating liquid.

SUMMARY

The present disclosure provides a coating apparatus including a nozzle provided with a storage chamber that stores a coating liquid and a slit-like flow path that is in communication with the storage chamber, and configured to discharge the coating liquid from a discharge port formed at a front end of the flow path; a moving mechanism configured to move the nozzle and a substrate relatively to each other along a surface of the substrate; a pressure adjusting unit configured to adjust pressure inside the storage chamber, and a pressure control unit configured to control the pressure adjusting unit so as to adjust pressure inside the storage chamber, in which the pressure control unit controls the pressure adjusting unit such that the inside of the storage chamber becomes a negative pressure, and fills the coating liquid in the inside of the storage chamber while slowly decreasing the negative pressure inside the storage chamber.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
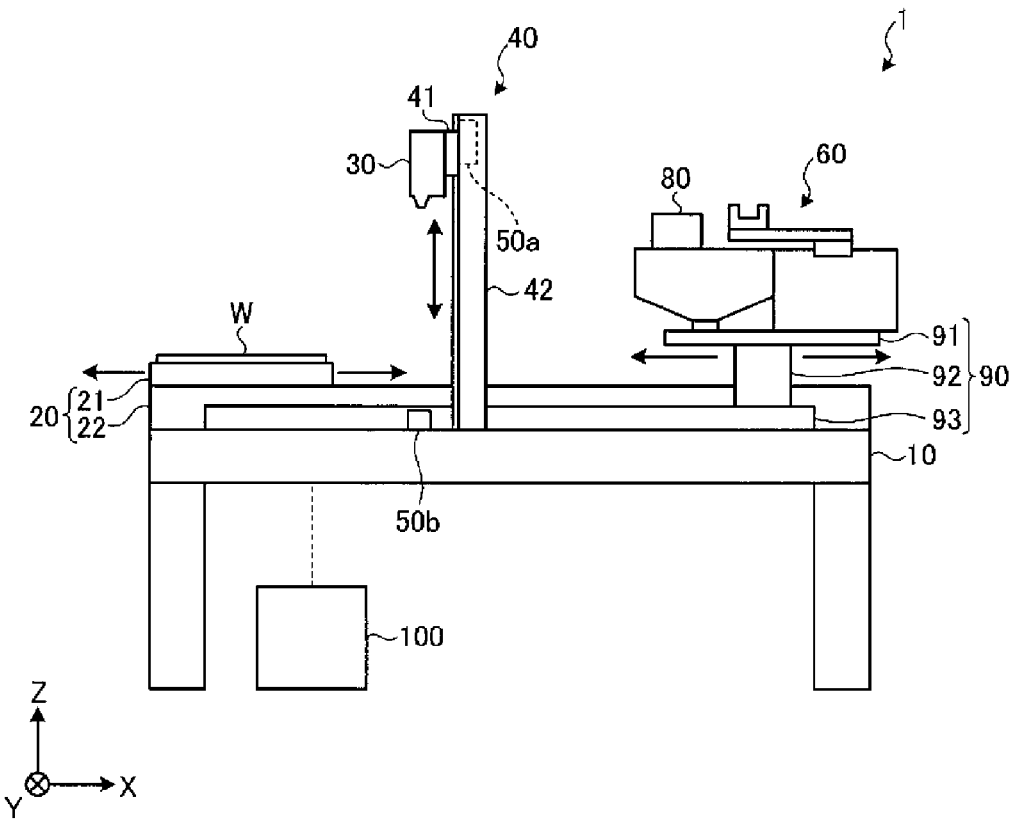
FIG. 1 is a schematic side view illustrating a configuration of a coating apparatus according to the first exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

However, in the above-mentioned prior-art techniques, there was room for further improvement from the viewpoint of making a work of filling a coating liquid in a nozzle efficient.

An aspect of the present disclosure is to provide a coating apparatus and a method for filling a coating liquid, which can make a work of filling a coating liquid in a nozzle efficient.

A coating apparatus according to one aspect of the exemplary embodiment includes a nozzle, a moving mechanism, a pressure adjusting unit and a pressure control unit. The nozzle is provided with a storage chamber that stores a coating liquid and a slit-like flow path that is in communication with the storage chamber, and configured to discharge the coating liquid from a discharge port formed at a front end of the flow path. The moving mechanism moves the nozzle and a substrate relatively with each other along the surface of the substrate. The pressure adjusting unit adjusts the pressure inside the storage chamber. The pressure control unit controls the pressure adjusting unit so as to adjust the pressure inside the storage chamber. The pressure control unit controls the pressure adjusting unit such that the inside of the storage chamber becomes a negative pressure, and fills the coating liquid in the storage chamber while slowly decreasing the negative pressure inside the storage chamber.

The above-mentioned coating apparatus further includes a contact member extending in the longitudinal direction of the discharge port. The pressure control unit fills the coating liquid in a state where the discharge port of the nozzle is brought into contact with the contact member.

In the above-mentioned coating apparatus, the nozzle is in communication with the inside of the storage chamber and the outside of the storage chamber, and is provided with a liquid supply port that supplies the coating liquid, which is supplied from the outside, to the inside of the storage chamber, and the liquid supply port is in a slit shape extending in the longitudinal direction of the flow path. Further, the liquid supply port is disposed in the vicinity of the boundary portion between the storage chamber and the flow path.

In the above-mentioned coating apparatus, the pressure control unit maintains the pressure inside the storage chamber at the time when the filling of the coating liquid in the inside of the storage chamber is completed, until the coating of the coating liquid is started. Further, the pressure control unit controls the pressure adjusting unit such that the discharge rate becomes constant during coating the coating liquid on the substrate to adjust the pressure inside the storage chamber.

The above-mentioned coating apparatus further includes a liquid surface detecting unit configured to detect the liquid surface of the coating liquid stored in the storage chamber. Further, the above-mentioned coating apparatus further includes a coating processing control unit configured to determine whether or not the liquid surface is flat, based on the result detected by the liquid surface detecting unit, and in the case of being determined that the liquid surface is flat, start the coating processing with the nozzle.

In the above-mentioned coating apparatus, a part of the storage chamber is formed with a transparent member, and the liquid surface detecting unit detects the liquid surface through the transparent member from the outside of the nozzle.

The above-mentioned coating apparatus further includes a prism that reflects or refracts light, and the liquid surface detecting unit is disposed inclined at a predetermined angle with respect to the liquid surface, and picks up an image of the liquid surface viewed from the direction parallel to the liquid surface.

A method for filling a coating liquid according to one aspect of the exemplary embodiment includes a preparation process and a filling process. The preparation process includes: providing a nozzle provided with a storage chamber that stores a coating liquid and a slit-like flow path that is in communication with the storage chamber, and configured to discharge the coating liquid from a discharge port formed at a front end of the flow path; and adjusting the inside of the storage chamber to a negative pressure. The filling process includes filling the coating liquid in the inside of the storage chamber while decreasing slowly the negative pressure inside the storage chamber as adjusted in the adjusting process.

According to the aspect of the exemplary embodiment, the filling of the coating liquid in a nozzle may be efficiently conducted.

Hereinafter, exemplary embodiments of the coating apparatus and the nozzle of the present disclosure will be described in detail with reference to the drawings attached herewith. Further, the present disclosure is not limited to the exemplary embodiments as described below.

(First Exemplary Embodiment)

FIG. 1 is a schematic side view illustrating a configuration of a coating apparatus according to the first exemplary embodiment. Further, herein, in order to clarify positional relations, the X-axis, Y-axis and Z-axis are defined as being orthogonal to each other, and the Z-axis is regarded as a vertically upward direction.

As shown in FIG. 1, a coating apparatus 1 according the first exemplary embodiment is provided with a disposing table 10, a first moving mechanism 20, a nozzle 30 and an elevation mechanism 40.

The first moving mechanism 20 is a mechanism configured to move a substrate W in a horizontal direction, and is provided with a substrate holding unit 21 and a driving unit 22. The substrate holding unit 21 has a horizontal top surface on which a suction port is formed, and holds the substrate W on the horizontal top by suction from the suction port. The driving unit 22 is disposed on the disposing table 10, and moves the substrate holding unit 21 in the horizontal direction (herein, X-axis direction). The first moving mechanism 20 moves the substrate holding unit 21 using the driving unit 22 to move the substrate W held by the substrate holding unit 21 in the horizontal direction.

The nozzle 30 is a long nozzle extending in a direction (Y-axis direction) orthogonal to the moving direction (X-axis direction) of the substrate W, and is disposed above the substrate W held by the substrate holding unit 21. The configuration of the nozzle 30 will be described below.

The elevation mechanism 40 is a mechanism configured to elevate the nozzle 30, and is provided with a fixing unit 41 and a driving unit 42. The fixing unit 41 fixes the nozzle 30. The elevation mechanism 40 moves the fixing unit 41 in the vertical direction using the driving unit 42 to elevate the nozzle 30 fixed to the fixing unit 41.

Further, the coating apparatus 1 is provide with a thickness measuring unit 50a, a nozzle height measuring unit 50b, a nozzle cleaning unit 60, a nozzle stand-by unit 80, a second moving mechanism 90 and a control device 100.

The thickness measuring unit 50a is disposed above the substrate W (herein, at the elevation mechanism 40), and measures the distance up to the top of the substrate W. In addition, the nozzle height measuring unit 50b is disposed below the substrate W (herein, at the displacing table 10), and measures the distance up to the lower end surface of the nozzle 30.

The measurement results from the thickness measuring unit 50a and the nozzle height measuring unit 50b are transmitted to the control device 100, and are used to determine the height of the nozzle 30 in the coating processing. Further, as the thickness measuring unit 50a and the nozzle height measuring unit 50b, for example, a laser displacement meter may be used.

The nozzle cleaning unit 60 is a processing unit configured to remove the coating liquid adhered to the front end of the nozzle 30. The configuration of the nozzle cleaning unit 60 will be described below.

The nozzle stand-by unit 80 has an accommodating space for accommodating the nozzle 30. The accommodating space is maintained in a thinner atmosphere. By putting the nozzle on standby in the accommodating space, the coating liquid in the nozzle 30 is suppressed from being dried. The configuration of the nozzle stand-by unit 80 will be described below as well.

The second moving mechanism 90 is a mechanism configured to move the nozzle cleaning unit 60 and the nozzle stand-by unit 80 in the horizontal direction, and is provided with a disposing unit 91, a supporting unit 92 and a driving unit 93.

The disposing unit 91 is a plate member configured to dispose the nozzle cleaning unit 60 and the nozzle stand-by unit 80 in substantially horizontal position. The disposing unit 91 is supported by the supporting unit 92 in a predetermined height, specifically in such a height that the substrate W held by the substrate holding unit passes below the disposing unit 91.

The second moving mechanism 90 moves the supporting unit 92 in the horizontal direction using the driving unit 93 to move the nozzle cleaning unit 60 and the nozzle stand-by unit 80 disposed on the disposing unit 91 in the horizontal direction.

The control device 100 controls operations of the coating apparatus 1. The control device 100 is, for example, a computer, and is provided with a control unit and a storage unit, which are not illustrated. The storage unit stores a program that controls various processings such as a coating processing. The control unit controls the operations of the coating apparatus 1 by reading out and executing the program stored in the storage unit.

Further, the program may be recorded in a recording medium readable by a computer, and installed from the recording medium to the storage unit of the control device 100. The recording medium readable by a computer may be, for example, a hard disc (HD), a flexible disc (FD), a compact disc (CD), a magnet optical disc (MO), or a memory card.

Figure 2A:
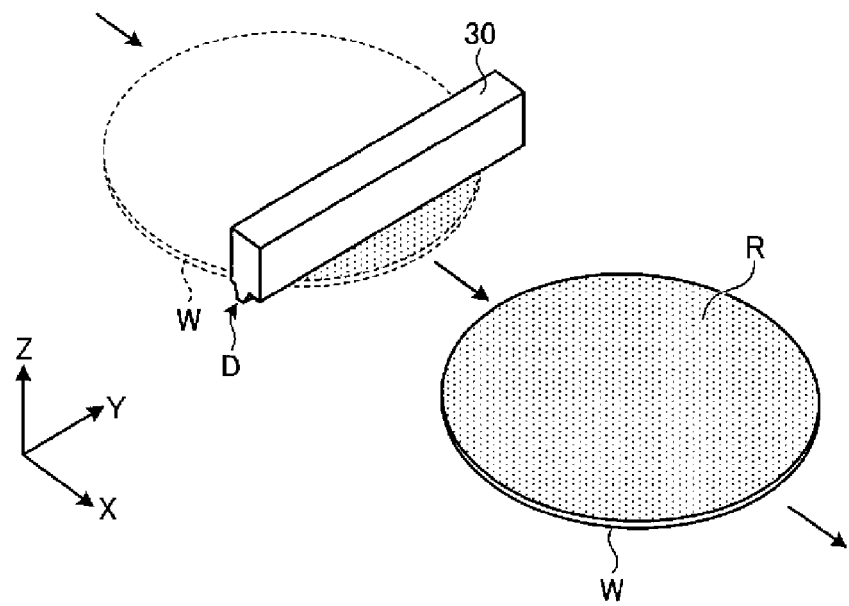
FIG. 2A is a schematic explanatory view of the coating apparatus.
Figure 2B:
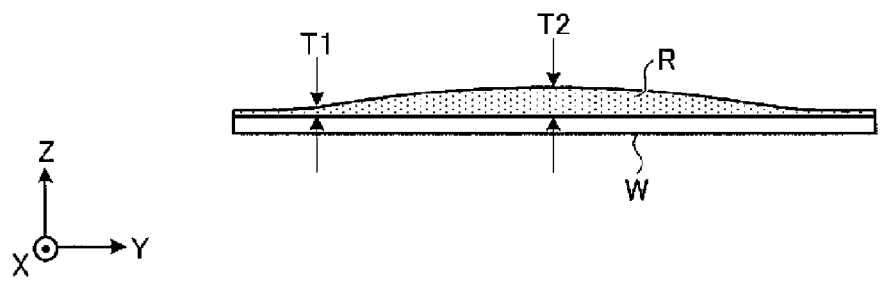
FIG. 2B is a schematic view of a wafer after a coating processing when viewed in a scanning direction.

Next, the configuration of the nozzle 30 and the contents of the coating processing performed by the coating apparatus 1 will be described in detail. First, the coating processing will be schematically described with reference to FIGS. 2A and 2B. FIG. 2A is a schematic explanatory view of the coating apparatus. FIG. 2B is a schematic view of a wafer after the coating processing when viewed in a scanning direction.

The coating processing performed by the coating apparatus 1 is a processing of spreading a coating liquid to form a coating film, by moving the substrate W in the horizontal direction in a state where the coating liquid exposed from the long nozzle 30 is brought into contact with the substrate W.

As illustrated in FIG. 2A, the nozzle 30 is a long member extending in a direction (Y-axis direction) orthogonal to the moving direction (X-axis direction) of the substrate W, and discharges a coating liquid R from a long discharge port D formed at the lower end.

First, the coating apparatus 1 exposes the coating liquid R from the discharge port D of the nozzle 30. At this time, the coating apparatus 1 can maintain the state where the coating liquid R is exposed from the discharge port D, by controlling the pressure inside the nozzle 30, which will be described below.

Subsequently, the coating apparatus 1 moves the nozzle downwardly using the elevation mechanism (see FIG. 1) to bring the coating liquid into contact with the top of the substrate W. Then, the coating apparatus 1 moves the substrate W in the horizontal direction using the first moving mechanism (see FIG. 1). As a result, the coating liquid R is spread on the top surface of the substrate W to form a coating film. Further, the coating film formed on the substrate W by the coating apparatus 1 is a thick film having a thickness of 10 μm or more.

However, in the case of coating a coating liquid on a substrate by using a conventional nozzle, there is a concern that the film thickness uniformity may deteriorate in the longitudinal direction of the nozzle. Specifically, as illustrated in FIG. 2B, there is a concern that the film thickness T1 at both ends in the longitudinal direction of the nozzle may become thinner than the film thickness T2 at the central portion in the longitudinal direction of the nozzle. One of the reasons may be that the coating liquid R coated on the substrate W agglomerates at the central portion by surface tension.

Accordingly, the coating apparatus 1 according to the first exemplary embodiment includes a plurality of small chambers formed by dividing the inside of the nozzle 30 along the longitudinal direction of the nozzle 30, and controls the pressure inside respective small chambers separately. Accordingly, since it is possible to adjust the discharge rate from the discharge port D for every small chamber, that is, along the longitudinal direction of the nozzle 30, it is possible to suppress the film thickness uniformity in the longitudinal direction of the nozzle 30 from deteriorating, thereby enhancing the film thickness uniformity.

Figure 3A:
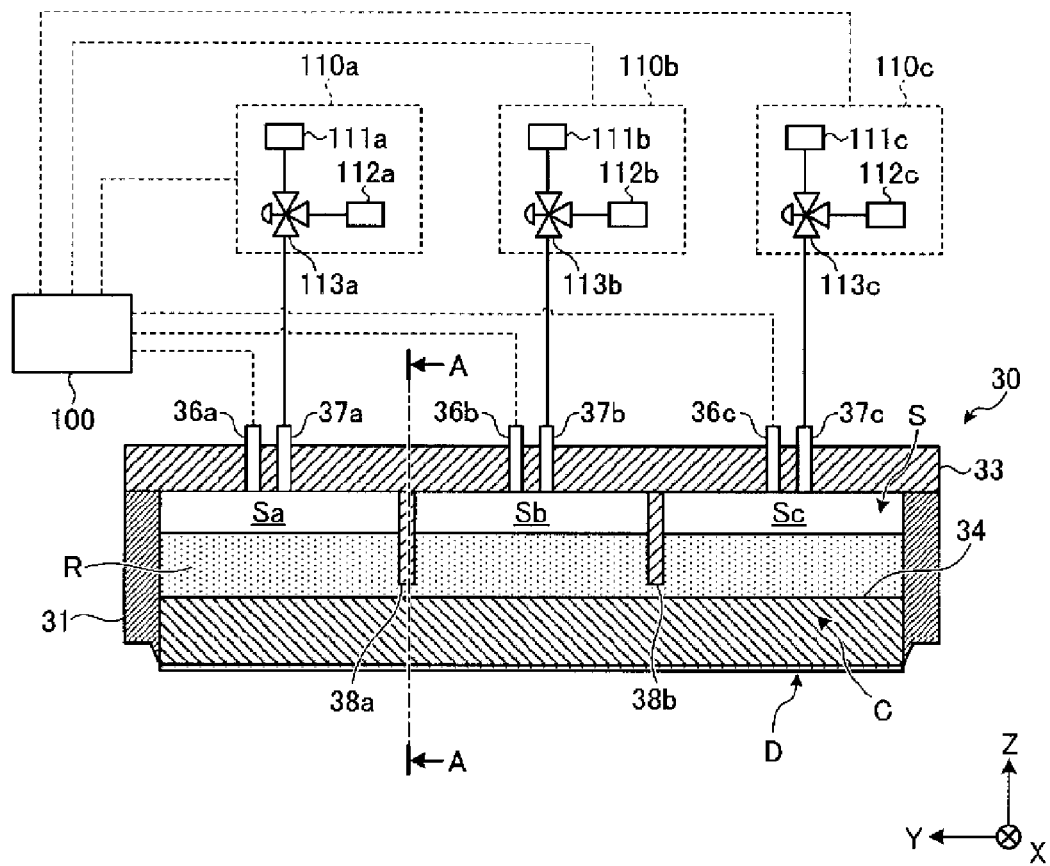
FIG. 3A is a schematic vertical cross-sectional view illustrating a configuration of a nozzle.
Figures 3B, 4:
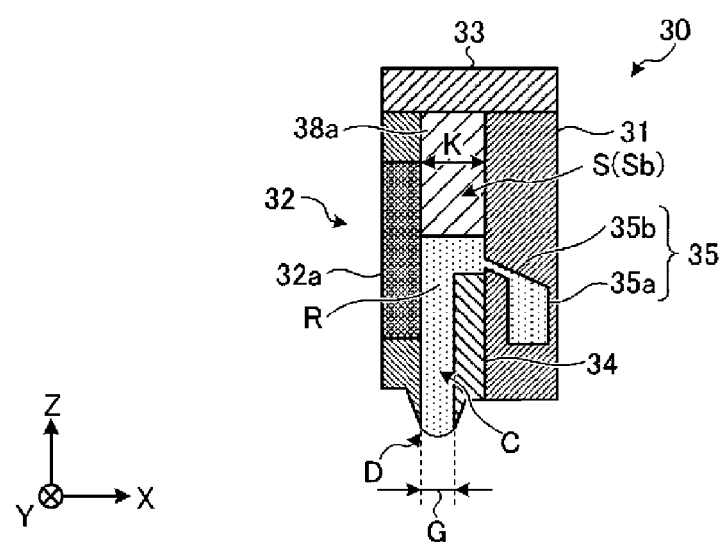
FIG. 3B is a cross-sectional view taken along line A-A in FIG. 3A.
FIG. 4 is a view illustrating an example of pressure control.

Hereinafter, the configuration of the nozzle 30 and the contents of the pressure control performed on every small chamber will be described in detail. FIG. 3A is a schematic vertical cross-sectional view illustrating a configuration of a nozzle. FIG. 3B is a cross-sectional view taken along line AA in FIG. 3A. FIG. 4 is a view illustrating an example of pressure control.

As illustrated in FIGS. 3A and 3B, the nozzle 30 is provided with a storage chamber S that stores the coating liquid R and a slit-like flow path C that is disposed at the lower portion of the storage chamber S and in communication with the storage chamber, and discharges the coating liquid R from the discharge port D formed at a front end of the flow path (that is, the lower end surface of the nozzle 30).

More specifically, the nozzle 30 is provided with a first main body 31 that defines a rear portion and both lateral portions, a second main body 32 that defines a front portion, a cover 33 that defines a ceiling portion, and a long land 34 that is disposed on a surface of the first main body 31 facing to the second main body 32. And, in the space inside the nozzle 30 defined by the first main body 31, the second main body 32 and the cover 33, the space with a width K, which is interposed between the first main body 31 and the second main body 32, functions as the storage chamber S, and the space with a width G narrower than the width K, which is interposed between the land 34 and the second main body 32, functions as the flow path C. The width of the flow path C is constantly the width G, and the width of the discharge port D formed at the front end of the flow path C is the width G as well.

The width G is set to a value such that, in the state where the pressure inside the storage chamber S is equal to the pressure outside the storage chamber S, the surface tension of the coating liquid R becomes smaller than the gravity acting on the coating liquid R to drop the coating liquid R from the discharge port D at a predetermined flow rate. Specifically, the width G is calculated by changing the width G, the viscosity of the coating liquid R and the material of the nozzle 30 in a test performed in advance, and then, evaluating the condition of the coating liquid R in that case.

The nozzle 30 according to the first exemplary embodiment is provided with partition plates 38a, 38b in the storage chamber S. The partition plates 38a, 38b are all substantially flat members, and are disposed at a predetermined interval along the longitudinal direction of the nozzle 30 in a state where the broad surfaces of the partition plates 38a, 38b are oriented to the longitudinal direction of the nozzle 30. By the partition plates 38a, 38b, the storage chamber S is partitioned into a plurality of small chambers Sa, Sb, Sc along the longitudinal direction (Y-axis direction) of the flow path C.

Further, although there is exemplified herein a case where the nozzle 30 is provided with two partition plates 38a, 38b, the number of the partition plates provided by the nozzle may be two or more.

Both lateral surfaces of the partition plates 38a, 38b are in contiguity with the first main body 31 and the second main body, respectively, and the top surface is in contiguity with the cover 33. On this account, when the coating liquid R is stored in the respective small chambers Sa to Sc, closed spaces surrounded by the liquid surface of the coating liquid R and the inner walls of the respective small chambers Sa to Sc are formed in the respective small chambers Sa to Sc.

Further, the small chambers Sa to Sa are not completely independent from each other, but are in communication with each other at the flow path C side. Accordingly, for example, when the storage chamber S is filled with the coating liquid R, the small chambers Sa to Sc may suppress the amount of the coating liquid R from being ununiform.

The cover of the nozzle 30 is provide with pressure measuring units 36a, 36b, 36c and pressure adjusting tubes 37a, 37b, 37c penetrating the cover 33, respectively. The pressure measuring units 36a to 36c are measuring units configured to measure the pressure of the closed space inside the respective small chambers Sa to Sc. The respective pressure measuring units 36a to 36c are electrically connected to the control device 100 to input measurement results to the control device 100.

Further, the pressure measuring units 36a to 36c may be arranged in any manner as long as they are in communication with the closed spaces inside the respective small chambers Sa to Sc. For example, the pressure measuring units 36a to 36c may penetrate the first main body 31.

The pressure adjusting tubes 37a to 37c are connected to pressure adjusting units 110a, 110b, 110c which adjust the pressure inside the respective closed spaces, respectively.

The pressure adjusting units 110a to 110c have a configuration that exhausting units 111a to 111c such as a vacuum pump, and gas supply sources 112a to 112c supplying a gas such as N$_2$ are connected via conversion valves 113a to 113c to the pressure adjusting tubes 37a to 37c.

The respective pressure adjusting units 110a to 110c are electrically connected to the control device 100 to adjust the degree of opening of the conversion valves 113a to 113c in accordance with instructions. Accordingly, any one of the exhausting units 111a to 111c or the gas supply sources 112a to 112c may be connected to the pressure adjusting tubes 37a to 37c to adjust the amount exhausted from the inside of the respective small chambers Sa to Sc, or to adjust the amount of the gas supplied to the respective small chambers Sa to Sc. Accordingly, the coating apparatus 1 may adjust the pressure such that the measurement result of the pressure measuring units 36a to 36c, that is, the pressure inside the respective small chambers Sa to Sc becomes a predetermined value.

In this case, the coating liquid R in the small chambers Sa to Sc is raised upward by making the pressure inside the small chambers Sa to Sc lower than the pressure outside the nozzle 30 by the exhaustion of the inside of the small chambers Sa to Sc. Therefore, it is possible to suppress the coating liquid R from being dropped from the discharge port D. Further, by supplying gas inside the small chambers Sa to Sc, coating liquid R remained in the small chambers Sa to Sc may be extruded or purged after coating the coating liquid R.

Further, the configuration of the pressure adjusting units 110a to 110c is not limited to the present exemplary embodiment. The configuration may be arbitrarily set as long as the pressure inside the respective small chambers Sa to Sc can be controlled. For example, each of the exhausting units 111a to 111c and the gas supply sources 112a to 112c may be provided with the pressure adjusting tubes 37a to 37c and the pressure adjusting valves, each of which is separately connected to the cover 33.

As described above, in the nozzle 30, the storage chamber S is partitioned into a plurality of small chambers Sa to Sc by the partition plates 38a, 38b. By separately controlling the pressures inside the small chambers Sa to Sc using the pressure adjusting units 110a to 110c, the film thickness uniformity in the longitudinal direction of the nozzle 30 may be suppressed from deteriorating. Herein, the contents of the pressure control of the small chambers Sa to Sc in the coating processing will be described.

Hereinafter, the pressure state lower than the pressure outside the storage chamber S is referred to as a "negative pressure". Further, in the case of changing the value of the negative pressure, for example, the case of changing the value in a direction where its absolute value becomes larger such as a case of changing from "−400 Pa" to "−450 Pa", it will be referred to as "lowering the pressure" or "raising the degree of vacuum".

In the case of performing the coating processing, the coating apparatus 1 adjusts the pressure inside the respective small chambers Sa to Sc to a negative pressure.

And, the coating apparatus 1 according to the first exemplary embodiment controls the pressure adjusting units 110a to 110c such that the pressure of the small chamber Sb located at the central portion in the longitudinal direction of the flow path C is relatively lower than the pressure of the small chambers Sa, Sc located at both ends in the longitudinal direction of the flow path C, as illustrated in FIG. 4.

By setting the pressure of the small chamber Sb located at the central portion in the longitudinal direction to be low, that is, by increasing the force pulling the coating liquid upward, it becomes difficult for the coating liquid R stored in the small chamber Sb to be discharged from the discharge port D. As a result, the amount of the coating liquid R discharged from the central portion in the longitudinal direction of the discharge port D becomes less than the amount of the coating liquid R discharged from both of the ends in the longitudinal direction of the discharge port D.

Therefore, by setting the amount of the coating liquid R discharged from the central portion in the longitudinal direction to be relatively small, it is possible to relieve the phenomenon that the film thickness T1 at both ends in the longitudinal direction of the nozzle becomes thinner than the film thickness T2 at the central portion in the longitudinal direction of the nozzle (see FIG. 2). Accordingly, it is possible to enhance the film thickness uniformity by the nozzle 30 according to the first exemplary embodiment.

The pressure of the respective small chambers Sa to Sc is determined based on the film thickness profile obtained by using a conventional nozzle in which flow resistance is uniform in the longitudinal direction, specifically, the thickness distribution of the coating liquid in the case of performing coating on the substrate W by using a nozzle that is not provide with partition plates. That is, by determining the pressure of the small chamber Sb located at the central portion in the longitudinal direction and the pressure of the small chambers Sa, Sc located at both ends in the longitudinal direction, respectively, so as to make up the difference between the film thickness T1 at both ends in the longitudinal direction and the film thickness T2 at the central portion in the longitudinal direction, it may be ensured that the film thickness uniformity in the longitudinal direction of the nozzle 30 is suppressed from deteriorating.

Figure 5:
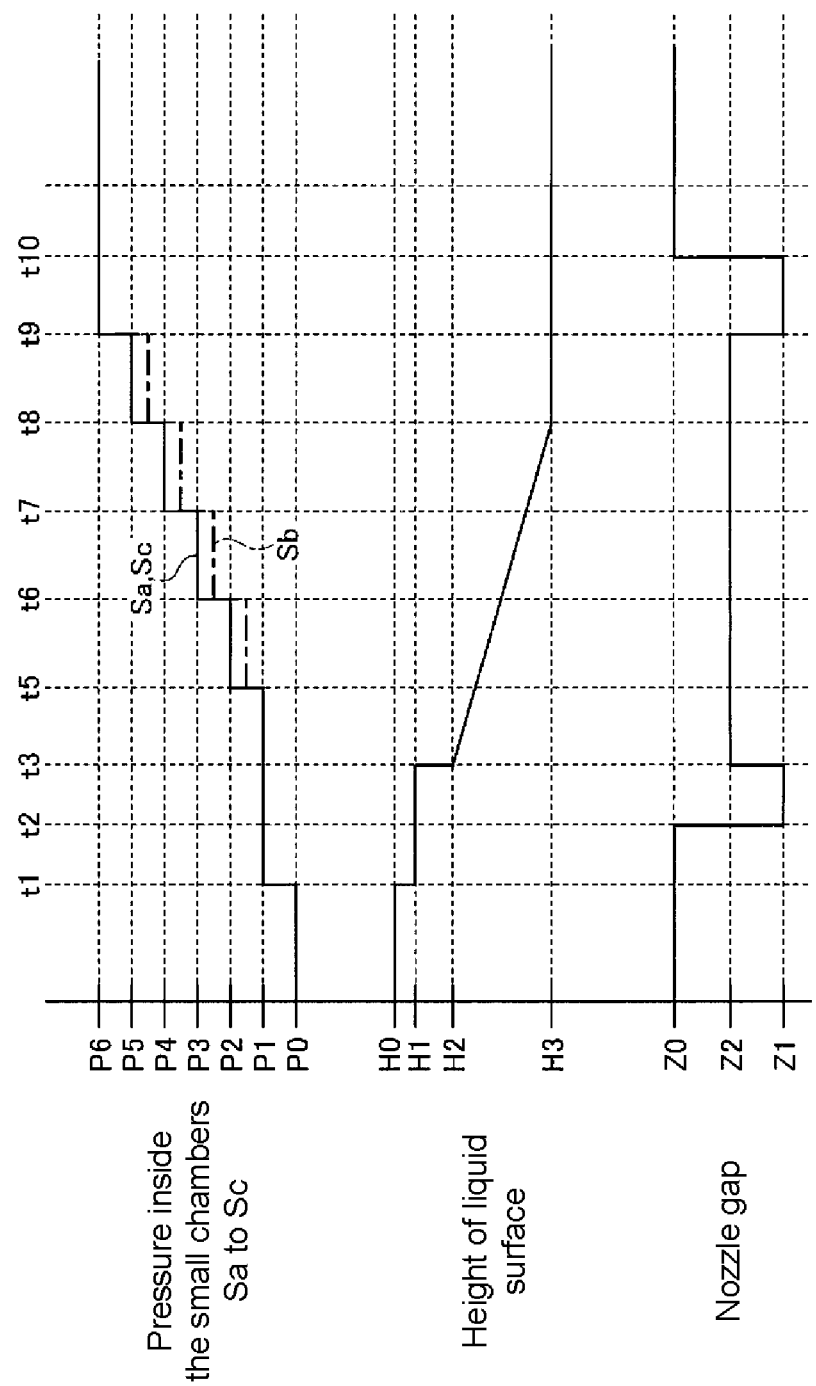
FIG. 5 is a time chart illustrating a state change of the respective apparatuses in a coating processing.
Figure 6A:
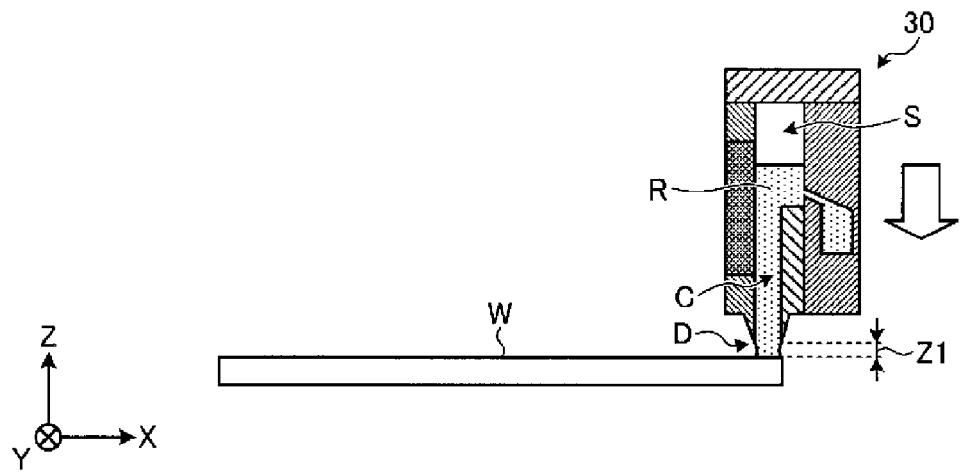
FIG. 6A is a schematic view illustrating a state of a coating processing.
Figure 6B:
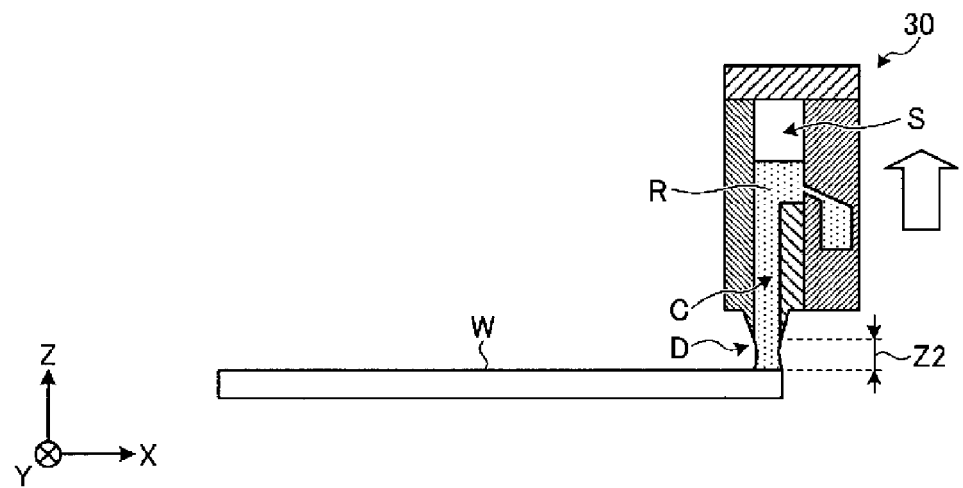
FIG. 6B is a schematic view illustrating a state of a coating processing.
Figure 6C:
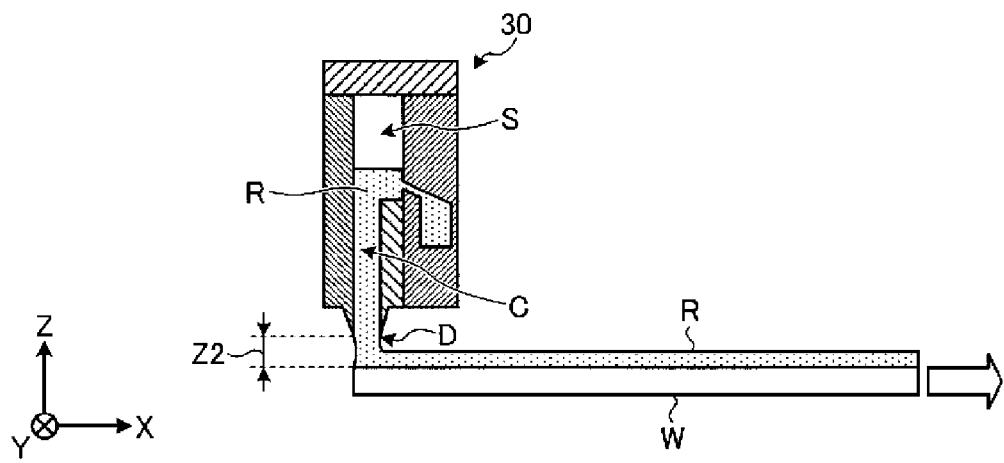
FIG. 6C is a schematic view illustrating a state of a coating processing.

Next, the operations in the coating processing will be described with reference to FIG. 5 and FIGS. 6A to 6C. FIG. 5 is a time chart illustrating a state change of the respective apparatuses in the coating processing. FIGS. 6A to 6C are schematic views illustrating a state of the coating processing.

Further, it is assumed that the nozzle 30 is filled with the coating liquid R. The amount of the coating liquid R to be filled in the nozzle 30 may be an amount capable of coating the coating liquid R on the whole surface of the substrate W at least once.

Further, after the nozzle 30 is filled with the coating liquid R in a coating liquid filling processing as described below (see the step S101 in FIG. 7), the pressure in the respective small chambers Sa to Sc is adjusted to a predetermined value P0 (see FIG. 5) until the next coating processing (see the step S108 in FIG. 7) is started. As a result, the coating liquid R is maintained in the nozzle 30 without being dropped from the discharge port D until the coating processing is started. Further, the predetermined value P0 is a negative pressure (for example, −450 Pa) lower than the pressure (atmosphere) outside the storage chamber S.

When the coating processing is started, the coating apparatus 1 first adjusts the pressure in the respective small chambers Sa to Sc to P1 (for example, −440 Pa) higher than P0 by using the pressure adjusting units 110a to 110c (see the time t1 in FIG. 5). As a result, the gravity acting on the coating liquid R slightly exceeds the surface tension of the coating liquid R and the negative pressure in the respective small chambers Sa to Sc, and thus, the coating liquid R maintained in the nozzle 30 is exposed from the discharge port D. Accordingly, the height of the liquid surface of the coating liquid R stored in the storage chamber S decreases from H0 to H1.

Subsequently, the coating apparatus 1 moves down the nozzle 30 by using the elevation mechanism 40 (see FIG. 1), and as illustrated in FIG. 5, the distance between the discharge port D and the substrate W (hereinafter, referred to as a "nozzle gap") is set to a predetermined distance Z1 (see the time t2 in FIG. 5). Accordingly, the coating liquid R exposed from the discharge port D comes into contact with the top of the substrate W.

Further, the nozzle gap Z0 is calculated based on the distance to the top of the substrate W obtained by the thickness measuring processing as described below (see the step S107 in FIG. 7). The nozzle gap Z1 is a value determined in advance by testing.

Subsequently, the coating apparatus 1 moves up the nozzle 30 to set the nozzle gap to Z2 (>Z1) (see the time t3 in FIG. 5). Accordingly, the coating liquid R exposed from the discharge port D comes to a state of being tensioned upwardly while being in contact with the top of the substrate W, as illustrated in FIG. 6B. As a result, the height of the liquid surface of the coating liquid R stored in the storage chamber S decreases from H1 to H2. In addition, the nozzle gap Z2 is set depending on the film thickness of the coating film to be formed on the substrate W.

Thereafter, the coating apparatus 1 moves the substrate W up to the position that the end portion at the negative direction side of the X-axis of the substrate W is disposed directly under the nozzle 30 at a predetermined rate, by using the first moving mechanism 20 (see FIG. 1). As a result, the coating liquid W in the storage chamber S is discharged from the discharge port D, and thus, the coating liquid R is coated on the top surface of the substrate W.

Herein, the coating apparatus 1 adjusts the pressure inside the respective small chambers Sa to Sc depending on the moving distance of the substrate W. As a result, the coating apparatus may suppress the deterioration of the film thickness uniformity in the longitudinal direction of the nozzle 30 as well as the deterioration of the film thickness uniformity in the moving direction (scanning direction) of the substrate W.

For example, the coating apparatus 1 increases the pressure inside the small chambers Sa, Sc from P2 (for example, −430 Pa) to P5 (for example, −400 Pa) stepwise by the pressure adjusting units 110a, 110c as the liquid surface of the coating liquid R in the small chambers Sa, Sc located at both ends in the longitudinal direction is lowered (see the times t5 to t8 in FIG. 5). Further, the coating apparatus 1 increases the pressure inside the small chamber Sb to the pressure (for example, −440 Pa to −410 Pa) lower than P2 to P5, respectively, stepwise by the pressure adjusting unit 110b.

When the liquid surface of the coating liquid R inside the small chambers Sa to Sc is lowered, the head pressure by the coating liquid R acting on the discharge port D is reduced. Assuming that the pressure inside the small chambers Sa to Sc and the pressure outside the small chambers Sa to Sc are unchanged and constant during this period, since the force extruding the coating liquid R from the discharge port D decreases as much as the head pressure decreases, the discharge rate of the coating liquid R decreases.

Accordingly, in the present exemplary embodiment, the decrease in head pressure in the discharge port D due to the lowering of the liquid surface is complemented by increasing the pressure inside the small chambers Sa to Sc stepwise by the pressure adjusting units 110a to 110c as the height of the liquid surface of the coating liquid R in the small chambers Sa to Sc is lowered. As a result, the discharge rate of the coating liquid R from the discharge port D is maintained constantly. Accordingly, it is possible to form a coating film having a uniform film thickness in the plane of the substrate W.

Accordingly, the coating apparatus 1 adjusts the pressure inside the respective small chambers Sa to Sc by controlling the pressure adjusting units 110a to 110c such that the discharge rate of the coating liquid R becomes constant while coating the coating liquid R on the substrate W, by the control of the control device 100. As a result, the coating apparatus 1 may suppress the deterioration of the film thickness uniformity in the scanning direction, as well as in the longitudinal direction of the nozzle 30.

The pressure inside the small chambers Sa to Sc may be adjusted, for example, depending on the relative moving distance between the nozzle 30 and the substrate W. In this case, a correlation between a moving distance of the nozzle 30 and a predetermined value for the pressure inside the small chamber Sa to Sc may be calculated in advance, and then, the pressure inside the small chambers Sa to Sc may be individually adjusted based on the correlation. By calculating such the correlation in advance, it is possible to calculate the decrement in head pressure from the amount of the coating liquid R consumed at a predetermined position of the nozzle 30 in the substrate W, by which the pressure inside the respective small chambers Sa to Sc may be adjusted.

Further, the pressure inside the small chambers Sa to Sc may be adjusted depending on the height of the liquid surface of the coating liquid R in the small chambers Sa to Sc. In this case, the value of the pressure inside the small chambers Sa to Sc to be increased by the pressure adjusting units 110a to 110c is calculated, for example, based on the height of the liquid surface of the coating liquid R detected by the liquid surface detecting unit 160 (see FIG. 8) as described below.

Specifically, the difference between the height of the liquid surface of the coating liquid R before starting the coating processing and the height of the liquid surface of the coating liquid R after starting the coating processing is calculated. Then, the decrement in head pressure for the discharge port D may be calculated by multiplying the difference by the density of the coating liquid R. Accordingly, by increasing the pressure inside the small chambers Sa to Sc as much as the decrement in head pressure by the pressure adjusting units 110a to 110c, the head pressure for the discharge port D becomes constant. As a result, since the discharge rate of the coating liquid R from the discharge port D becomes constant, it is possible to form a coating film having a uniform film thickness in the plane of the substrate W.

Further, it is also considered that another pressure measurement mechanism is provided in the flow path C to directly calculate the head pressure acting on the coating liquid R in the flow path C, and the pressure adjusting units 110a to 110c then adjusts the pressure inside the small chambers Sa to Sc such that the head pressure becomes constant.

In any cases, since the pressure inside the small chambers Sa to Sc is adjusted by the pressure adjusting units 110a to 110c such that the discharge rate of the coating liquid R from the discharge port D becomes constant, in other words, such that the head pressure acting on the coating liquid R of the discharge port D becomes constant, it is possible to suppress the deterioration of the film thickness uniformity in the scanning direction, as well as in the longitudinal direction of the nozzle 30.

Further, the coating apparatus 1 may maintain the coating liquid R against the gravity acting on the coating liquid R or control the discharge rate of the coating liquid R to the substrate W by adjusting the pressure inside the small chambers Sa to Sc. On this account, even in the case where the width of the discharge port is widened to handle a coating liquid having a high viscosity of, for example, several thousand cP, dripping from the discharge port or film thickness defect may be suppressed when coating. That is, a high viscosity coating liquid may be uniformly coated on the substrate W without wasting the coating liquid.

When the end portion at the negative direction side of the X-axis of the substrate W is moved to a position directly under the nozzle 30, the coating apparatus 1 moves down the nozzle 30 to bring the discharge port D close to the substrate W by a distance Z1 (see the time t9 in FIG. 5). At the same time, the coating apparatus 1 increase the pressure inside the small chambers Sa to Sc up to Pa (for example, −390 Pa) by the pressure adjusting units 110a to 110c to prevent coating defects from occurring when the coating liquid R previously coated on the substrate W is introduced into the storage chamber S.

Then, the coating apparatus 1 moves up the nozzle 30 to the nozzle gap Z0 (see the time t10 in FIG. 5). As a result, the supply of the coating liquid R from the discharge port D to the substrate W is stopped, and thus, the coating processing is ended.

Meanwhile, since the coating apparatus 1 may perform the film thickness control in both of the scanning direction and the longitudinal direction of the nozzle 30, a two-dimensional film thickness control may be performed on the top of the substrate W. That is, for example, in a case where a thin film portion or a thick film portion exits locally due to the test coating performed in advance, the coating liquid R may also be coated locally thickly or thinly for such a portion.

Referring back to FIGS. 3A and 3B, the remaining configuration of the nozzle 30 will be described. A part of the second main body 32 is formed as a transparent member 32a. Accordingly, the coating liquid R stored in the storage chamber S may be visible through the transparent member 32a. The coating apparatus 1 detects the position of the liquid surface of the coating liquid R inside the storage chamber S through the transparent member 32a from the outside of the nozzle 30. This matter will be described below.

Further, the nozzle 30 is provided with a temporary storage unit 35 configured to temporarily store the coating liquid R filled in the storage chamber S, inside the first main body 31.

The temporary storage unit 35 is provided with a temporary storage chamber 35a configured to store the coating liquid R, and a path 35b in communication with the temporary storage chamber 35a and the storage chamber S. The temporary storage chamber 35a is a long space having a similar length to that of the storage chamber S. Further, the path 35b extends from the upper portion of the temporary storage chamber 35a toward the storage chamber S in an obliquely upward direction, and has a slit shape extending along the longitudinal direction of the flow path C. Further, the nozzle 30 may not be provided with the temporary storage unit 35.

Next, description will be made on a processing order of the substrate processing including the coating processing as described above. FIG. 7 is a flow chart illustrating a processing order performed by the coating apparatus 1. Further, each processing order illustrated in FIG. 7 is performed by the coating apparatus 1 based on the control of the control device 100. A control unit provided in the control device 100 corresponds to one example of the processing control unit and the coating processing control unit in the present disclosure.

Figure 7:
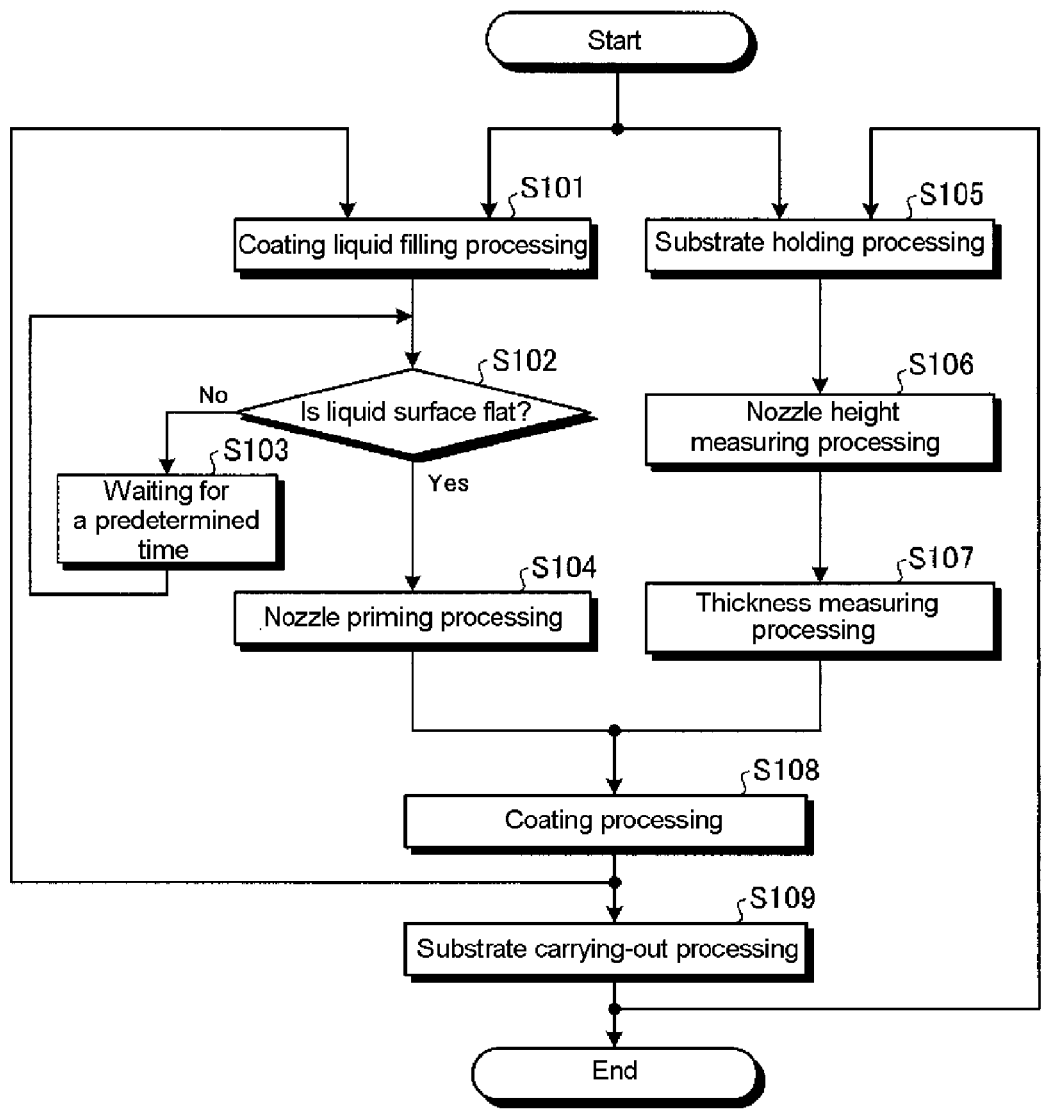
FIG. 7 is a flow chart illustrating a processing order of a substrate processing performed by a coating apparatus.

Herein, the processing of the steps S101 to S109 as illustrated in FIG. 7 is repeated until a processing is ended for a plurality of substrates included in one lot. Further, once one lot of substrate processing is ended, the next lot of substrate processing is started, but, prior to the next lot, a nozzle cleaning processing is performed to clean the front end of the nozzle. The nozzle cleaning processing will be described below.

As illustrated in FIG. 7, the coating apparatus 1 performs the processing of the steps S101 to S104 in parallel with the processing of the steps S105 to S107, and performs the above-mentioned coating processing after the processing of the step S104 and the processing of the step S107 are ended. First, the processing of the steps S101 to S104 will be described.

In the processing of the steps S101 to S104, the coating apparatus 1 first performs a coating liquid filling processing (step S101). In the coating liquid filling processing of the step S101, the coating apparatus 1 first moves the nozzle stand-by unit 80 to a position directly under the nozzle 30, and then moves down the nozzle 30 to be disposed in the nozzle stand-by unit 80. Then, in a state where the nozzle 30 is disposed in the nozzle stand-by unit 80, the coating liquid is filled in the nozzle 30.

Figure 8:
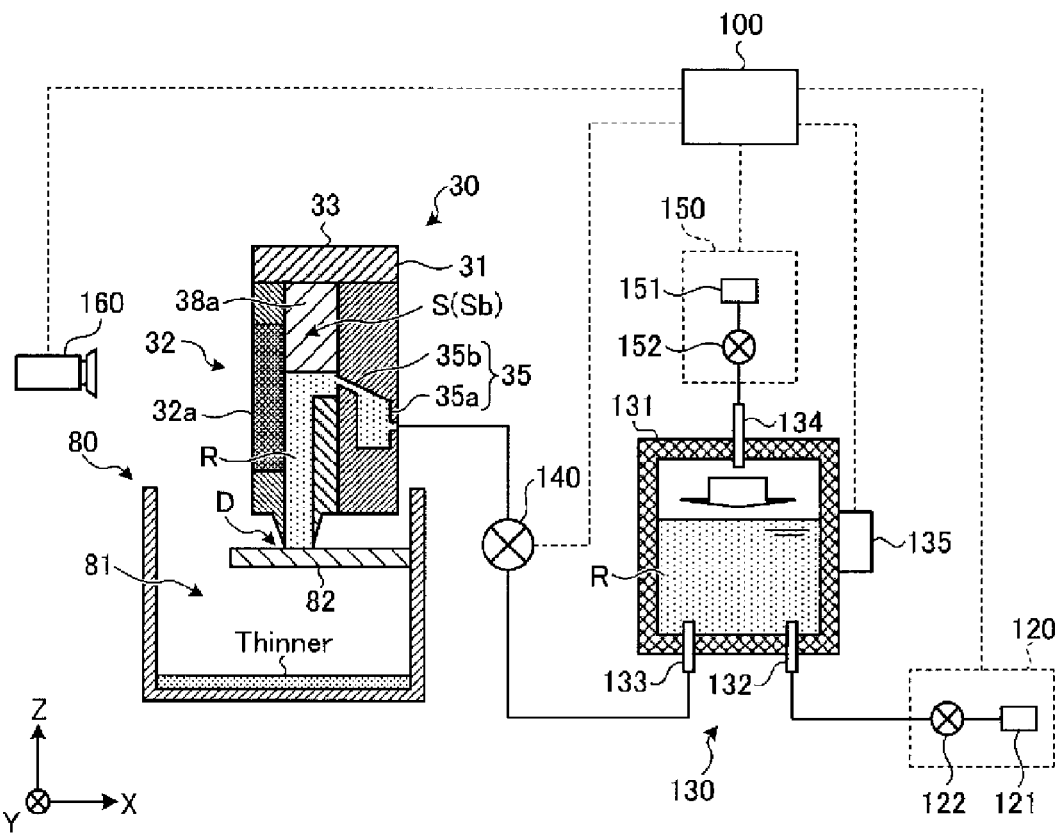
FIG. 8 is a schematic view illustrating a connection relation between an apparatus for a coating liquid filling processing and a nozzle.
Figure 9:
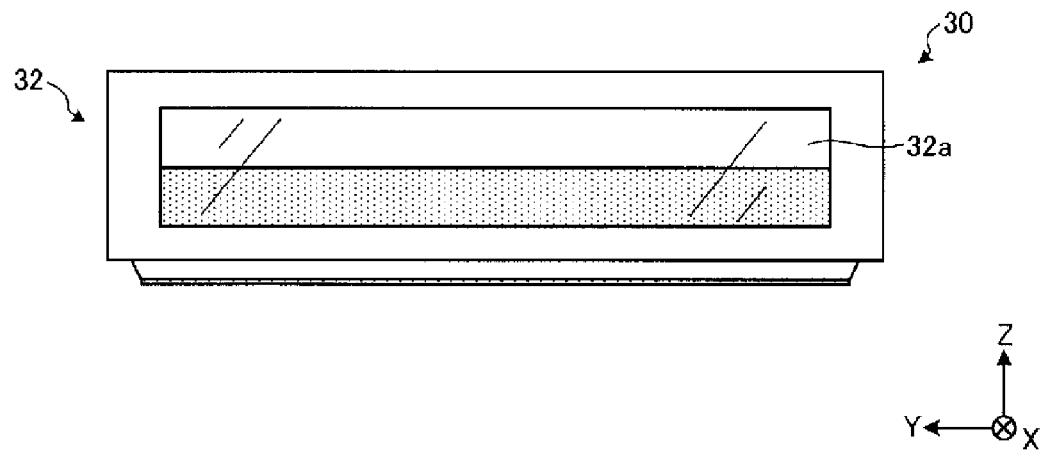
FIG. 9 is a schematic front view of a nozzle.
Figure 10A:
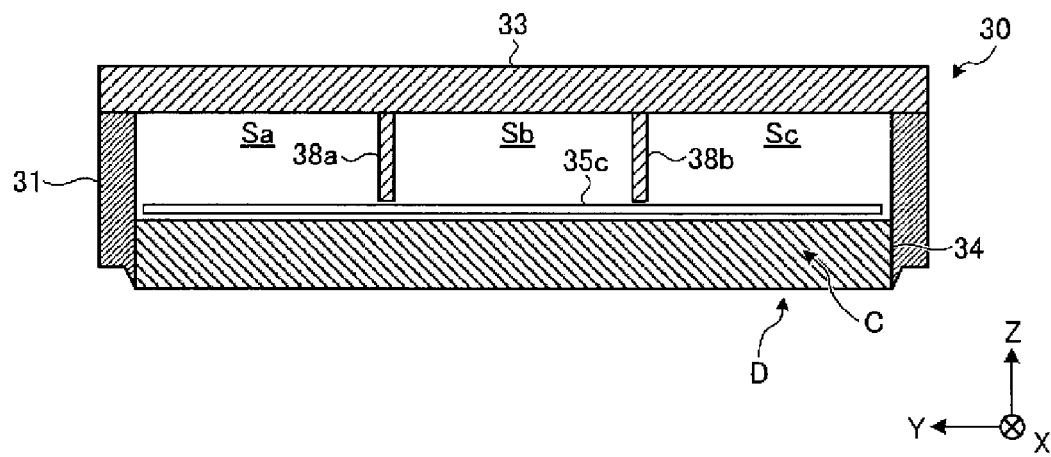
FIG. 10A is a schematic vertical cross-sectional view illustrating a configuration of a liquid supply port.
Figure 10B:
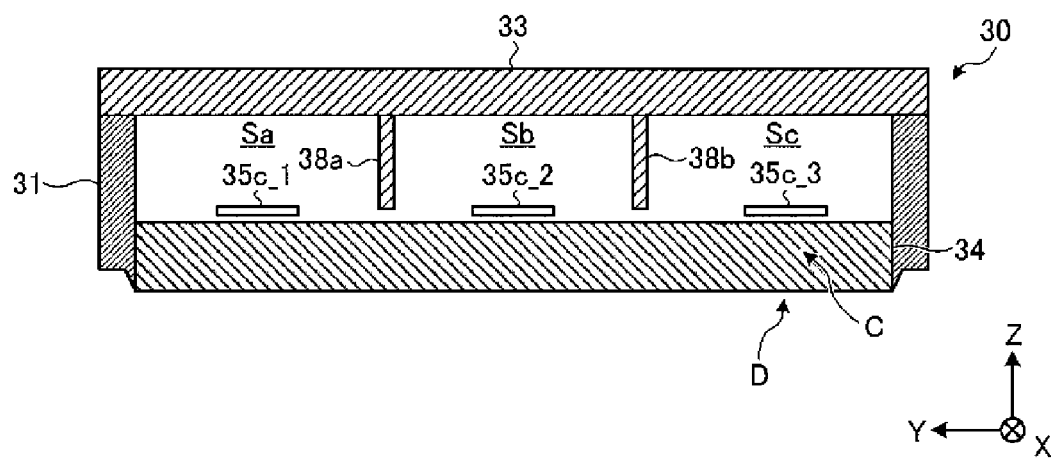
FIG. 10B is a schematic vertical cross-sectional view illustrating another configuration of a liquid supply port.

Herein, the content of the coating liquid filling processing will be described. FIG. 8 is a schematic view illustrating a connection relation between an apparatus for coating liquid filling processing and the nozzle 30. FIG. 9 is a schematic front view of the nozzle 30. FIG. 10A is a schematic vertical cross-sectional view illustrating a configuration of a liquid supply port. FIG. 10B is a schematic vertical cross-sectional view illustrating another configuration of a liquid supply port.

As illustrated in FIG. 8, the nozzle stand-by unit 80 has an accommodating space 81 capable of accommodating the nozzle 30. A thinner is stored in the accommodating space 81. As the thinner is volatilized, the inside of the accommodating space 81 is maintained in a thinner atmosphere.

Further, the accommodating space 81 is provided with a substantially flat contact member 82 extending in the longitudinal direction (Y-axis direction) of the discharge port D of the nozzle 30. The contact member 82 is formed of a resin material having a chemical resistance, such as, for example, a rubber.

The coating apparatus 1 brings the front end of the nozzle 30 into contact with the contact member 82 by moving down the nozzle 30 toward the accommodating space 81 of the nozzle stand-by unit 80. As a result, the discharge port D is in a state of being blocked by the contact member 82. The coating apparatus 1 fills the coating liquid R in the nozzle 30 in this state, and thus, it the coating liquid R may be suppressed from leaking out from the discharge port D during filling the coating liquid R.

Meanwhile, the coating apparatus 1 is further provided with a coating liquid supplying unit 120, an intermediate tank 130, a supply pump 140, a pressurizing unit 150 and the liquid surface detecting unit 160.

The coating liquid supplying unit 120 is provided with a coating liquid supply source 121 and a valve 122. The coating liquid supply source 121 is connected via a valve 122 to the intermediate tank 130. Further, the coating liquid supply source 120 is electrically connected to the control device 100, and the opening/closing of the valve 122 is controlled by the control device 100.

The intermediate tank 130 is interposed between the coating liquid supplying unit 120 and the nozzle 30. The intermediate tank 130 is provided with a tank body 131, a first supplying pipe 132, a second supplying pipe 133, a third supplying pipe 134 and a liquid surface sensor 135.

The tank body 131 stores the coating liquid R. The first supplying pipe 132 and the second supplying pipe 133 are provided at the bottom of the tank body 131.

Further, in the case where the nozzle 30 is not provided with the temporary storage unit 35, the nozzle 30 may be provided with a communication port in communication with the storage chamber S and the outside, and connected via the communication port to the second supplying pipe 133 to directly supply the coating liquid R to the storage chamber S.

The pressurizing unit 150 is connected to the third supplying pipe 134. The pressurizing unit 150 is provided with a gas supply source 151 that supplies a gas such as $N_2$ and a valve 152, and pressurizes the inside of the tank body 131 by supplying the gas to the inside of the tank body 131. The pressurizing unit 150 is electrically connected to the control device 100, and the opening/closing of the valve 152 is controlled by the control device 100.

Further, the liquid surface sensor 135 is a detecting unit configured to detect the liquid surface of the coating liquid R stored in the tank body 131. The liquid surface sensor 135 is electrically connected to the control device 100, and the detection result is input to the control device 100.

The supplying pump 140 is provided in the middle of the second supplying pipe 133, and supplies the coating liquid R, which is supplied from the intermediate tank 130, to the nozzle 30 at a predetermined amount. The supplying pump 140 is electrically connected to the control device 100, and the amount of the coating liquid supplied to the nozzle 30 is controlled by the control device 100.

The liquid surface detecting unit 160 is disposed in front of the nozzle 30, and detects the position of the liquid surface (hereinafter, referred to as "the height of the liquid surface") of the coating liquid R stored in the storage chamber S. Herein, as illustrated in FIG. 9, a part of the second main body 32, which forms the front portion of the nozzle 30, is formed by the transparent member 32a so that the coating liquid R stored in the storage chamber S may be visible through the transparent member 32a. The liquid surface detecting unit 160 is, for example, a charge coupled device (CCD) camera, and detects the position of the liquid surface of the coating liquid R by photographing the inside of the storage chamber S through the transparent member 32a from the front of the nozzle 30. The detection result by the liquid surface detecting unit 160 is input to the control device 100. Accordingly, the coating apparatus 1 may easily detect the height of the liquid surface of the coating liquid R.

Next, description will be made on the operation of the coating apparatus 1 in the coating liquid filling processing. The coating apparatus 1 determines the amount of the coating liquid R to be filled in the nozzle 30 (hereinafter, referred to as a "target amount") based on the detection result of the liquid surface detecting unit 160. Then, the coating apparatus 1 operates the supplying pump 140 to supply the target amount of the coating liquid R from the intermediate tank 130 to the temporary storage chamber 35a of the nozzle 30.

Figure 11:
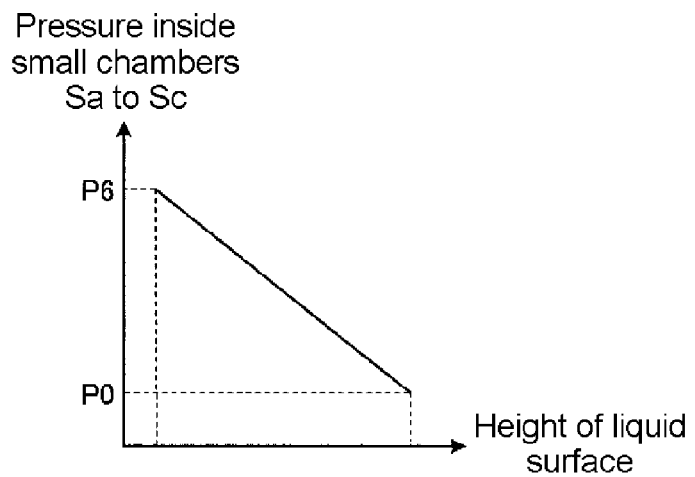
FIG. 11 is a view illustrating the contents of pressure control in a coating liquid filling processing.

At this time, the coating apparatus 1 supplies the coating liquid R to the respective small chambers Sa to Sc while adjusting the pressure inside the small chambers Sa to Sc by using the pressure adjusting units 110a to 110c (see FIG. 3A). Herein, the contents of the pressure control in the coating liquid filling processing will be described with reference to FIG. 11. FIG. 11 is a view illustrating the contents of pressure control in the coating liquid filling processing.

In the coating liquid filling processing, the pressure inside the small chambers Sa to Sc is adjusted to a negative pressure. As a result, the coating liquid R remaining in the small chambers Sa to Sc may be suppressed from leaking out from the discharge port D.

Then, as illustrated in FIG. 11, the coating apparatus 1 supplies the coating liquid R while slowly decreasing the pressure (that is, increasing the degree of vacuum) inside the small chambers Sa to Sc, which is adjusted to a negative pressure, in accordance with the height of the liquid surface of the respective small chambers Sa to Sc detected by the liquid surface detecting unit 160.

Specifically, the pressure inside the respective small chambers Sa to Sc at the time of starting the coating liquid filling processing is P6 (for example, −390 Pa), like the pressure inside the respective small chambers Sa to Sc at the time of terminating the coating processing. Meanwhile, the pressure inside the respective small chambers Sa to Sc at the time of completing the coating liquid filling processing is adjusted to the pressure P0 (for example, −450 Pa) before starting the coating process. And, the coating apparatus 1 changes the pressure from P6 to P0 in accordance to the height of the liquid surface of the respective small chambers Sa to Sc.

As described above, the coating apparatus 1 controls the pressure adjusting units 110a to 110c to set the inside of the small chambers Sa to Sc to a negative pressure, and supplies the coating liquid R to the inside of the small chambers Sa to Sc while slowly decreasing the negative pressure inside the small chambers Sa to Sc.

When the small chambers Sa to Sc is filled with the coating liquid R, and the liquid surface of the coating liquid R in the small chambers Sa to Sc rises, the head pressure by the coating liquid R acting on the discharge port D increases. During this time, if the pressure inside the small chambers Sa to Sc and the pressure outside the small chambers Sa to Sc are unchanged and constant, since the force pulling the coating liquid R upward is relatively weekend as much as the head pressure increases, the coating liquid easily leaks out from the discharge port D.

In this regard, the force pulling the coating liquid R upward may be complemented by slowly lowering the pressure in the small chambers Sa to Sc by the pressure adjusting units 110a to 110c as the height of the liquid surface of the coating liquid R in the small chambers Sa to Sc rises. Accordingly, it may be further ensured that the coating liquid R is suppressed from leaking out from the discharge port D during the coating liquid filling processing.

Further, during the time period until the coating processing is started after the supply of the coating liquid R into the small chambers Sa to Sc is ended, the coating apparatus 1 controls the pressure adjusting units 110a to 110c to maintain the pressure (that is, P0) in the small chambers Sa to Sc at the time that the supply of the coating liquid R into the small chambers Sa to Sc is ended. Accordingly, it is possible to efficiently perform the pressure control in the small chambers Sa to Sc in a series of the substrate processing.

Further, it is explained herein that the pressure is changed in accordance with the height of the liquid surface, but not limited thereto. For example, the pressure may be changed in accordance with a predetermined time.

Further, the coating apparatus 1 performs the supply of the coating liquid R to the nozzle 30, not directly from the coating liquid supply source 121, but from the intermediate tank 130 provided between the coating liquid supply source 121 and the nozzle 30. Accordingly, since the pipe length to the nozzle 30 may be shorten, the coating liquid may be easily supplied from the intermediate tank 130 to the nozzle 30 even in the case where the coating liquid has a high viscosity and it is difficult to supply the coating liquid from the coating liquid supply source 121.

Further, in the case where it is difficult to supply the coating liquid from the intermediate tank 130 to the nozzle 30, the coating apparatus 1 may supply the coating liquid R from the intermediate tank 130 to the nozzle 30 by increasing the pressure inside the tank body 131 using the pressurizing unit 150.

The coating liquid R is supplied from the intermediate tank 130 to the temporary storage chamber 35a of the nozzle 30, and then, supplied through the path 35b to the storage chamber S. Herein, the front end of the path 35b is formed with a slit-like liquid supply port 35c that is in communication with the storage chamber S and extends along the longitudinal direction of the flow path C, as illustrated in FIG. 10A. As a result, since the coating apparatus 1 may supply the coating liquid R equally along the longitudinal direction of the storage chamber S, the leaning of the coating liquid R to each of the small chambers Sa to Sc may be suppressed.

Further, the liquid supply port 35c is provided in the vicinity of the boundary between the land 34 (flow path C) and the storage chamber S, specifically at a side upper than the land 34 (flow path C) and lower than the partition plates 38a, 38b. Accordingly, by supplying the coating liquid R from as low part of the storage chamber S as possible, it is possible to suppress bubbles from being mixed into the coating liquid R when filling the coating liquid R.

Further, although there is exemplified herein a case where one liquid supply port 35c formed in a slit shape is formed over the respective small chambers Sa to Sc, the liquid supply port may be provided in each of the small chamber Sa to Sc, respectively.

For example, a liquid supply port 35c_1 is formed in the small chamber Sa, a liquid supply port 35c_2 is formed in the small chamber Sb, and a liquid supply port 35c_3 is formed in the small chamber Sc. The respective liquid supply ports 35c_1 to 35c_3 have a slit shape, and are in communication with each other in the path 35b. By such a configuration, the leaning of the coating liquid R in the small chambers Sa to Sc may be suppressed.

In the case where it is determined that the amount of the coating liquid R stored in the tank body 131 is lower than a predetermined amount based on the detection result, the coating apparatus 1 controls the coating liquid supplying unit 120 to supply the coating liquid R from the coating liquid supply source 121 to the tank body 131. As a result, the tank body 131 is replenished with the coating liquid R.

Referring back to FIG. 7, the substrate processing will be described continuously. After the coating liquid filling processing of the step S101, the coating apparatus 1 determines whether or not the liquid surface of the coating liquid R filled in the storage chamber S is flat, based on the detection result of the liquid surface detecting unit 160 (step S102). For example, the coating apparatus 1 calculates the difference between the highest position and the lowest position of the liquid surface, and then, if the difference is within a predetermined range, determines that the liquid surface is flat.

In this processing, if the liquid surface is not flat (step S102, No), the coating apparatus 1 waits for a predetermined length of time (step S103), and then, performs the determination of the step S102 again. The coating apparatus 1 repeats the processings of the step S102 and S103 until the liquid surface becomes flat, and when it is determined that the liquid surface is flat (step S102, Yes), the processing proceeds to a nozzle priming processing of the step S104.

As described above, since the coating apparatus 1 determines whether or not the liquid surface becomes flat based on the detection result of the liquid detecting unit 160, and when it is determined that the liquid surface becomes flat, starts the coating processing using the nozzle 30, the deterioration of the film thickness uniformity may be suppressed. That is, when the liquid surface is not flat, in other words, when the leaning of the coating liquid R occurs in the storage chamber S, there is a concern that the head pressure acting on the discharge port D of the nozzle 30 becomes uneven, thereby deteriorating the film thickness uniformity. Therefore, by starting the coating processing after the liquid surface becomes flat as described in the present exemplary embodiment, the deterioration of the film thickness uniformity may be suppressed.

Subsequently, the nozzle priming processing of the step S104 will be described. The nozzle priming processing refers to a processing of maintaining the state of the discharge port D by wiping the front end of the nozzle 30 using the nozzle cleaning unit 60. When the nozzle priming processing is started, the coating apparatus 1 returns the substrate W to the initial position (the position illustrated in FIG. 1), and moves the nozzle cleaning unit 60 to the position directly under the nozzle 30 by using the second moving mechanism 90. Then, the coating apparatus 1 wipes the coating liquid R exposed from the discharge port D by using the nozzle cleaning unit 60 to maintain the state of the discharge port D.

Figure 12:
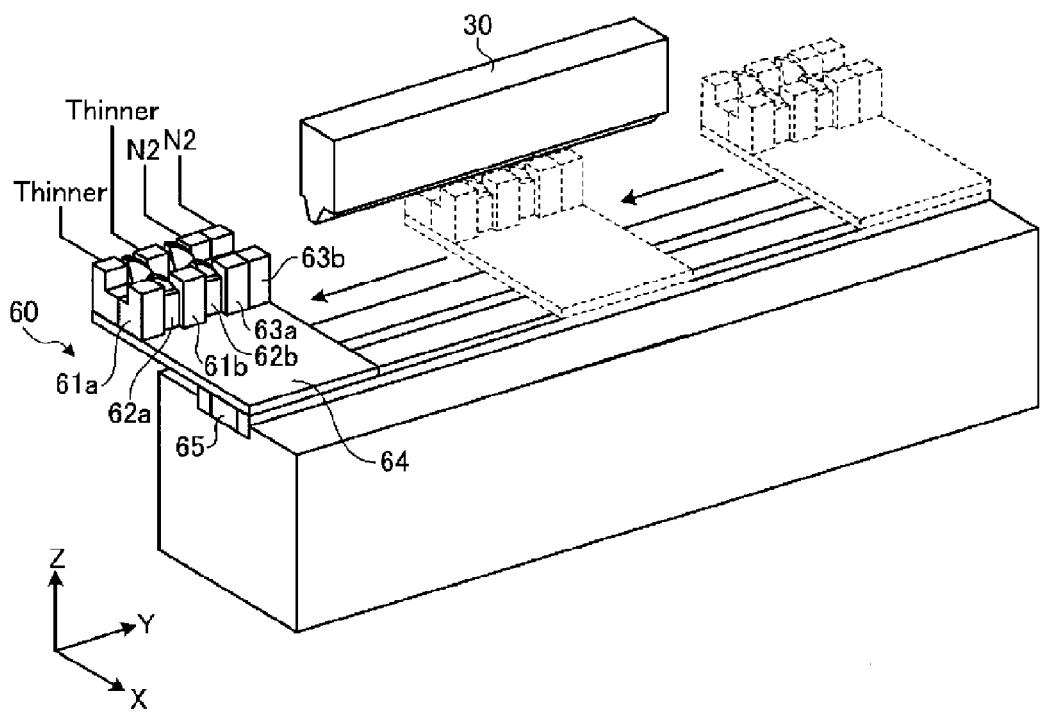
FIG. 12 is a schematic perspective view illustrating a configuration of a nozzle cleaning unit.

Herein, the configuration of the nozzle cleaning unit 60 and the contents of the nozzle priming processing will be described in reference with FIG. 12. FIG. 12 is a schematic perspective view illustrating the configuration of the nozzle cleaning unit 60.

As illustrated in FIG. 12, the nozzle cleaning unit 60 is provided with thinner discharging units 61a, 61b, a pad units 62a, 62b, $N_2$ ejecting units 63a, 63b, a disposing unit 64 and a driving unit 65.

The thinner discharging units 61a, 61b are connected via a pump, which is not illustrated, to a thinner supply source, and discharges a thinner supplied from the thinner supply source, from both lateral surfaces in the width direction of the nozzle 30 toward the front end of the nozzle 30. As a result, it is possible to dissolve the coating liquid adhered to the front end of the nozzle 30.

The pad units 62a, 62b are formed in an approximately V shape along the shape of the front end of the nozzle 30, and are connected to both side in the width direction of the front end of the nozzle 30. As the pad units 62a, 62b are moved by the driving unit 65 as described below, the coating liquid adhered to the front end of the nozzle 30 is wiped by the pad units 62a, 62b The $N_2$ ejecting units 63a, 63b are connected to a pump, which is not illustrated, to a $N_2$ supply source, and ejects $N_2$ supplied from the $N_2$ supply source, from both lateral surfaces in the width direction of the nozzle 30 toward the front end of the nozzle 30. As a result, the front end of the nozzle 30 is dried.

The thinner discharging units 61a, 61b, the pad units 62a, 62b and the $N_2$ ejecting units 63a, 63b are disposed on the disposing unit 64. Specifically, the thinner discharging unit 61a, the pad unit 62a, the thinner discharging unit 61b, the pad unit 62b, the $N_2$ ejecting unit 63a and the $N_2$ ejecting unit 63b are disposed in this order in parallel with the extending direction (Y-axis direction) of the nozzle 30.

The driving unit 65 moves the thinner discharging units 61a, 61b, the pad units 62a, 62b and the $N_2$ ejecting units 63a, 63b disposed on the disposing unit 64 in parallel with the extending direction (Y-axis direction) of the nozzle 30 by moving the disposing unit 64 in parallel with the extending direction of the nozzle 30.

When performing the nozzle priming processing, the coating apparatus 1 uses the pad units 62a, 62b only among the thinner discharging units 61a, 61b, the pad units 62a, 62b and the $N_2$ ejecting units 63a, 63b.

Specifically, the coating apparatus 1 moves the disposing unit 64 in the negative direction of the Y-axis by using the driving unit 65 in a state where the nozzle 30 is disposed at a position that the front end of the nozzle 30 is in contact with the pad units 62a, 62b by moving down the nozzle 30 using the elevation mechanism 40. As a result, the coating liquid R exposed from the discharge port D or the coating liquid R adhered to the front end of the nozzle 30 is wiped by the pad units 62a, 62b to maintain the state of the discharge port D.

After the nozzle priming processing is ended, the coating apparatus 1 starts the coating processing (step S108). As described above, since the coating apparatus 1 starts the coating processing after the state of the discharge port D is maintained by the nozzle priming processing, it is possible to enhance the film thickness uniformity immediately after the coating processing is started. Furthermore, since the coating apparatus 1 performs the nozzle priming processing immediately before the coating processing is started, the maintained state of the discharge port D may be easily kept.

Further, the thinner discharging units 61a, 61b and $N_2$ ejecting units 63a, 63b provided in the nozzle cleaning unit 60 are used in the nozzle cleaning processing performed between lots. That is, in the nozzle cleaning processing, the coating apparatus 1 moves the disposing unit 65 in the negative direction of the Y-axis by using the driving unit 65 in a state of discharging the thinner from the thinner discharging units 61a, 61b, and ejecting $N_2$ from the $N_2$ ejecting units 63a, 63b. Accordingly, the nozzle cleaning unit 60 performs, on the front end of the nozzle 30, thinner supply by the thinner discharging unit 61a, wiping by the pad unit 62b and $N_2$ ejection by the $N_2$ ejecting units 63a, 63b to clean the nozzle 30.

Subsequently, the processing of the steps S105 to S107 will be described. The coating apparatus 1 sucks and holds the substrate W disposed on the upper surface of the substrate holding unit 21 by using the substrate holding unit 21 (step S105), and then, performs a nozzle height measuring processing (step S106). In the nozzle height measuring processing, the coating apparatus 1 confirms whether or not the nozzle is located at a defined height by measuring the distance to the lower end surface of the nozzle 30 using the nozzle height detecting unit 50b. In this processing if the nozzle height deviates from the predetermined height, the coating apparatus 1 may perform a compensation of the nozzle height.

Further, the nozzle height measuring processing may be performed before the step S105. In addition, the nozzle height measuring processing may be performed in any one (for example, the first time) of the substrate processings performed repeatedly for every lot.

Subsequently, the coating apparatus 1 performs a thickness measuring processing (step S107). Specifically, the coating apparatus 1 moves the substrate W held in the substrate holding unit 21 to the lower position of the thickness measuring unit 50a, and then, measures the distance to the upper surface of the substrate W by using the thickness measuring unit 50a. The measurement result by the thickness measuring unit 50a is transmitted to the control device 100.

Further, the surface of the outer peripheral portion of the substrate W may possibly become roughened by each processing until the substrate W is transported to the coating apparatus 1. Therefore, it is preferable to set a position, which falls within a predetermined distance (for example, about 2 mm) from the outer periphery of the substrate W, as a measurement point.

Further, the coating apparatus 1 is provided with a plurality of the thickness measuring units 50a (for example, two units), and determines a value (for example, mean value), based on the measurement result obtained by each thickness measuring unit 50a as a distance to the upper surface of the substrate W.

When the thickness measuring processing is ended, the coating apparatus 1 moves the substrate W to a coating processing starting position (position at which an end portion in the positive direction of the X-axis of the substrate W is disposed directly below the nozzle 30). And, when the nozzle priming processing of the step S104 is ended, the coating apparatus 1 performs the coating processing immediately. Otherwise, when the nozzle priming processing of the step S104 is not ended, the coating apparatus 1 performs the coating processing immediately after the termination of the nozzle priming processing (step S108). The contents of the coating processing have been described above, and thus, the description thereof will be omitted here.

When the coating processing of the step S108 is ended, the coating apparatus 1 returns the processing to the step S101, and performs the processings of the step S101 to S104. Further, the coating apparatus 1 performs the processings of the step S105 to S107 again in parallel with the processings of the step S101 to S104 after performing the substrate carrying out processing (step 109). Further, the substrate carrying-out processing refers to a processing in which the substrate W subjected to the substrate processing is delivered to an external device after releasing the absorbing and holding of the substrate W by the substrate holding unit 21.

When terminating the processings of the step S101 to the step S109 described above with respect to all of the substrates W included in one lot, the coating apparatus 1 ends a series of the substrate processings for one lot.

As described above, the coating apparatus according to the first exemplary embodiment is provided with a nozzle, a moving mechanism, a pressure adjusting unit and a pressure control unit. The nozzle is provided with a storage chamber that stores a coating liquid and a slit-like flow path that is in communication with the storage chamber, and discharges the coating liquid from a discharge port formed at front end of the flow path. The moving mechanism moves the nozzle and a substrate relatively with each other along the surface of the substrate. The pressure adjusting unit adjusts pressure inside the storage chamber. The pressure control unit controls the pressure adjusting unit so as to adjust pressure inside the storage chamber. The pressure control unit controls the pressure adjusting unit such that the inside of the storage chamber becomes a negative pressure, and fills the coating liquid inside the storage chamber while slowly decreasing the negative pressure inside the storage chamber. Therefore, according to the coating apparatus of the first exemplary embodiment, the filling of the coating liquid to the nozzle may be efficiently conducted.

Further, in the first exemplary embodiment, the liquid surface detecting unit 160 is used to photograph the inside of the storage chamber S (see FIG. 10). However, since the storage chamber S has an elongated shape, the liquid surface detecting unit 160 needs to be disposed at a position spaced from the nozzle 30 by a predetermined distance in order to photograph the inside of the storage chamber S from one end to another end in the longitudinal direction of the storage chamber S. Therefore, a configuration for disposing the liquid surface detecting unit 160 in the vicinity of the nozzle 30 will be described with reference to FIGS. 13A and 13B and FIGS. 14A and 14B. FIGS. 13A and 13B, and FIGS. 14A and 14B are schematic views illustrating other examples of the liquid surface detecting method.

Figure 13A:
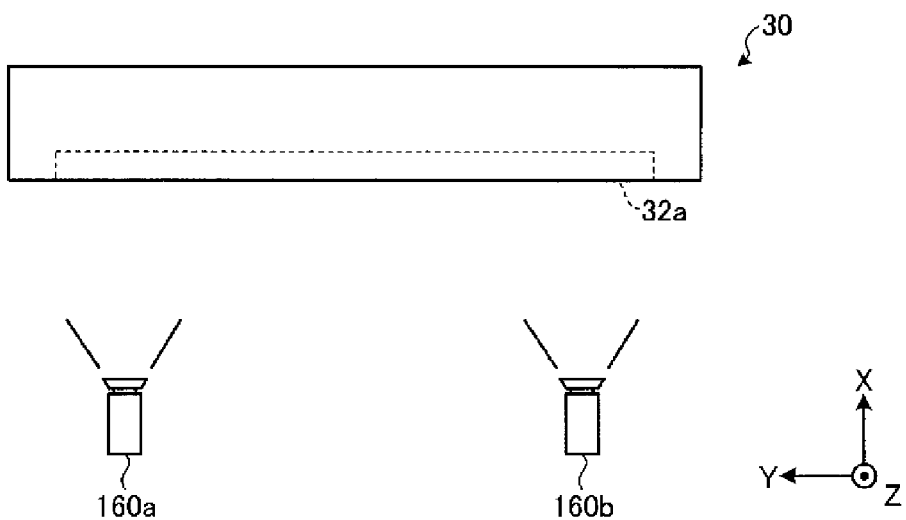
FIG. 13A is a schematic view illustrating another example of a liquid surface detecting method.

For example, as illustrated in FIG. 13A, the coating apparatus 1 may be provided with a plurality of the liquid surface detecting units (herein, two liquid surface detecting units 160a, 160b) which detect the liquid surface of the coating liquid R in front of the nozzle 30. As such, a plurality of the liquid surface detecting units are installed such that a range to be detected by the liquid surface detecting unit can be reduced. Therefore, the liquid surface detecting unit may be disposed in the vicinity of the nozzle 30.

Figure 13B:
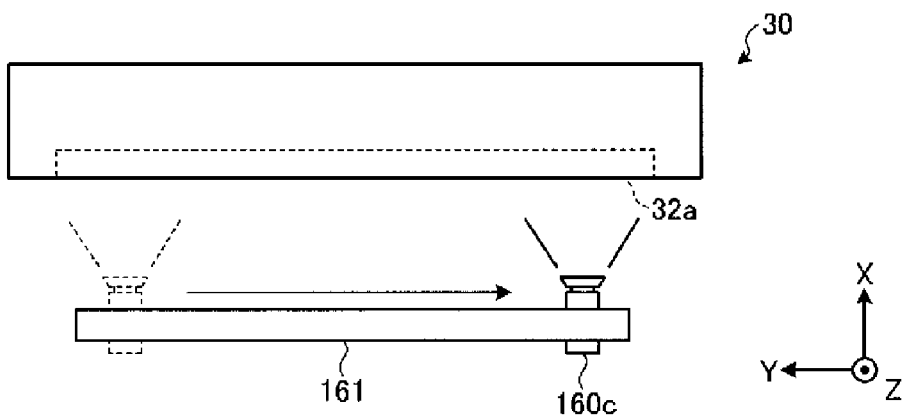
FIG. 13B is a schematic view illustrating another example of a liquid surface detecting method.

Further, as illustrated in FIG. 13B, the coating apparatus 1 may be provided with one liquid surface detecting unit 160c and a driving unit 161 that moves the liquid surface detecting unit 160c along the longitudinal direction (Y-axis direction) of the nozzle 30. By doing this, the liquid surface detecting unit may also be disposed in the vicinity of the nozzle 30.

Figure 14A:
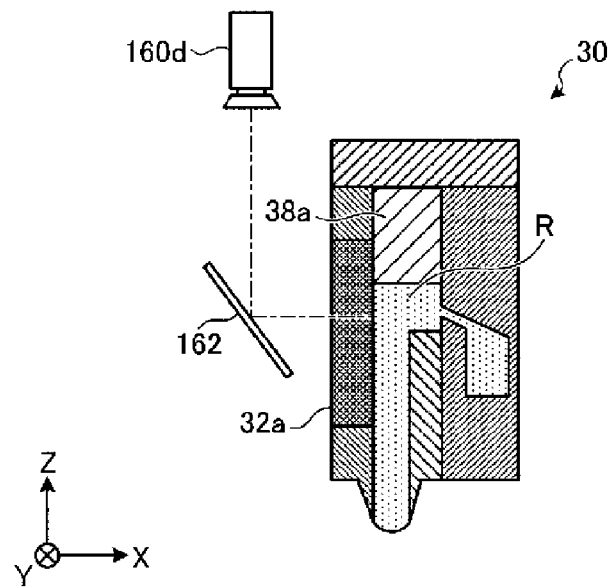
FIG. 14A is a schematic view illustrating another example of a liquid surface detecting method.

Further, if it is intended that the liquid surface detecting unit is to be disposed at a location other than the front of the nozzle 30, as illustrated in FIG. 14A, the liquid surface detecting unit 160d may be disposed above the nozzle 30 to be oriented downwardly to photograph the liquid surface of the coating liquid R through a prism 162 that reflects or refracts light.

As described above, the liquid surface detecting unit 60d may be disposed obliquely at a predetermined angle with respect to the liquid surface of the coating liquid R to photograph the liquid surface viewed from a direction approximately parallel to the liquid surface of the coating liquid R through the prism 162. Accordingly, it is possible to dispose the liquid surface detecting unit at a location other than front of the nozzle 30.

Figure 14B:
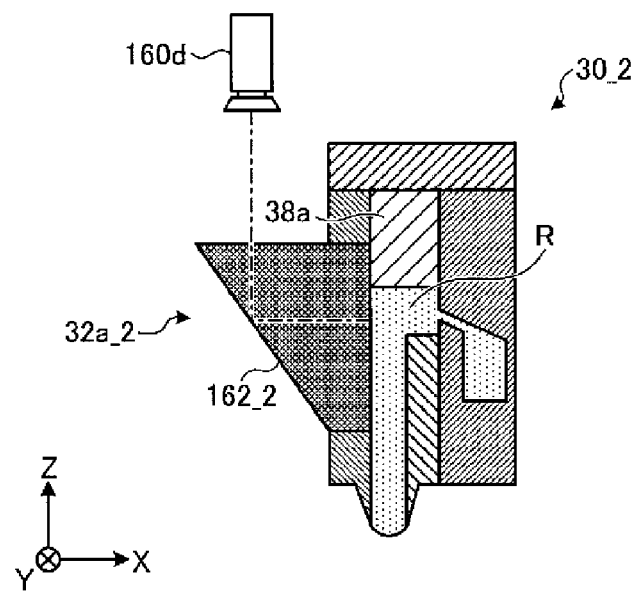
FIG. 14B is a schematic view illustrating another example of a liquid surface detecting method.

Further, the prism may be formed integrally with the nozzle. For example, as illustrated in FIG. 14B, the nozzle 30_2 may be provided with a transparent member 32a_2 which is provided with a prism 162_2 at the front portion thereof.

Further, although there is exemplified herein a case where the liquid surface detecting unit is an image capturing apparatus such as a CCD camera, the liquid surface detecting unit is not limited to an image capturing apparatus, but may include an optical sensor such as an infrared sensor.

(Second Exemplary Embodiment)

Figure 15:
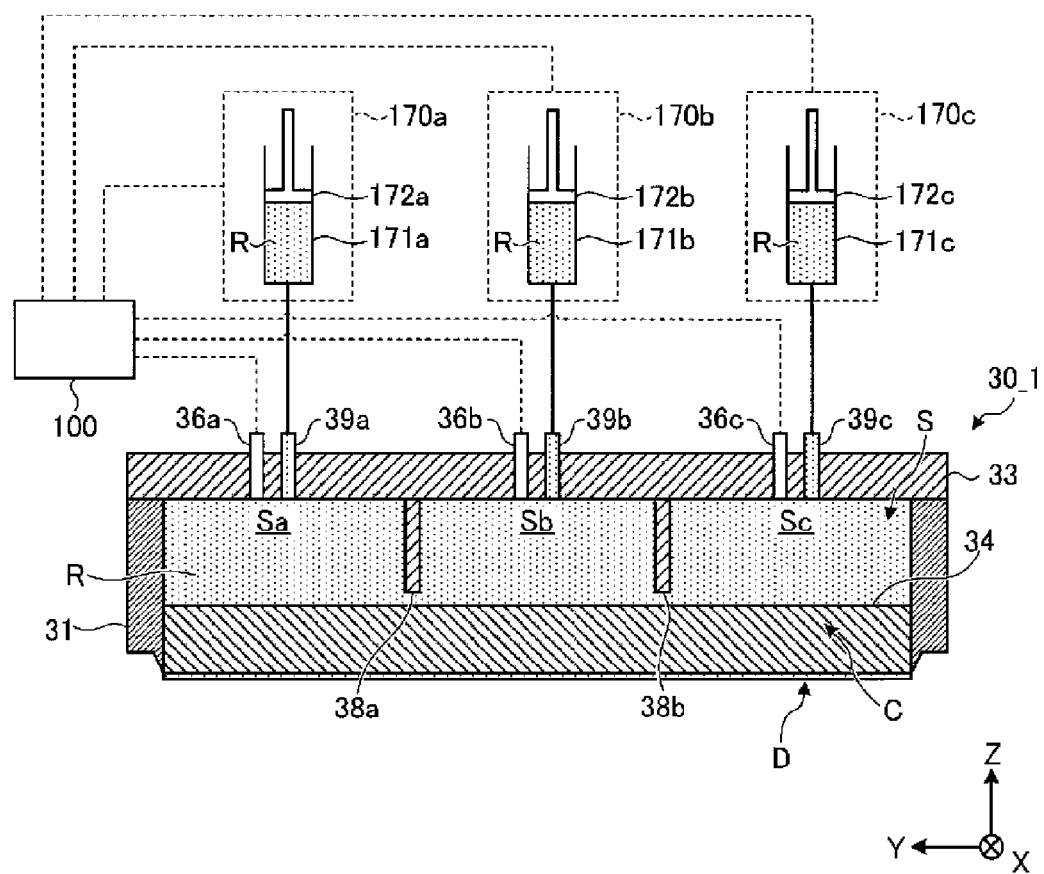
FIG. 15 is a view illustrating another example of a pressure control method of a small chamber.

By the way, in the first exemplary embodiment as described above, the pressure adjusting units 110a to 110c adjusts the pressure inside the respective small chambers Sa to Sc by supplying and exhausting gas with respect to the respective small chambers Sa to Sc. However, the pressure control method of the small chambers Sa to Sc is not limited thereto. Accordingly, another example of the pressure control method of the small chambers Sa to Sc will be described with reference to FIG. 15. FIG. 15 is a view illustrating another example of the pressure control method of the small chambers Sa to Sc.

As illustrated in FIG. 15, respective small chambers Sa to Sc of a nozzle 30_1 according to the second exemplary embodiment are fully charged with a coating liquid R. That is, the inside of the nozzle 30_1 is filled with the coating liquid R.

A cover 33 of the nozzle 30_1 is connected to pressure adjusting tubes 39a to 39c in correspondence with the respective small chambers Sa to Sc, respectively, instead of the pressure adjusting tubes 37a to 37c. The pressure adjusting tubes 39a to 39c are also filled with the coating liquid R. Further, the volume of the pressure adjusting tubes 39a to 39c is preferably not less than the volume of the coating liquid R capable of performing the coating on the substrate W at least once.

The pressure adjusting tubes 39a to 39c are connected to pressure adjusting units 170a to 170c, respectively. The pressure adjusting units 170a to 170c are, for example, syringe-type pumps, and are provided with outer containers 171a to 171c and pistons 172a to 172c.

The outer containers 171a to 171c are connected to a coating liquid supply source, which are not illustrated, and are filled with a coating liquid R supplied from the coating liquid supply source. The pistons 172a to 172c are inserted into the respective outer containers 171a to 171c, respectively.

The respective pressure adjusting units 170a to 170c are electrically connected to a control device 100 to allow the pistons 172a to 172c to advance or retreat according to instructions from the control device. By doing this, it is possible to supply the coating liquid R in the outer containers 171a to 171c through the pressure adjusting tubes 39a to 39c to the small chambers Sa to Sc, or to discharge the coating liquid R in the small chambers Sa to Sc through the pressure adjusting tubes 39a to 39c.

The pressure inside the small chambers Sa to Sc is increased by supplying the coating liquid R to the small chambers Sa to SC, and the pressure inside the small chambers Sa to Sc is decreased by discharging the coating liquid R from the small chambers Sa to Sc. By doing this, the coating apparatus 1 can adjust the pressure inside the small chambers Sa to Sc.

As described above, when the pressure inside the small chambers Sa to Sc is adjusted by supplying and exhausting gas with respect to the small chambers Sa to Sc, since the response of the change in discharge rate to the change in pressure becomes higher, it is possible to perform the film thickness control more precisely.

Further, in the second exemplary embodiment, since the storage chamber S is filled with the coating liquid R, there is no concern that leaning of the coating liquid R filled in the storage chamber S occurs. Accordingly, during or after the coating liquid filling processing, there is no need to wait until leaning of the coating liquid disappears.

(Third Exemplary Embodiment)

Figure 16:
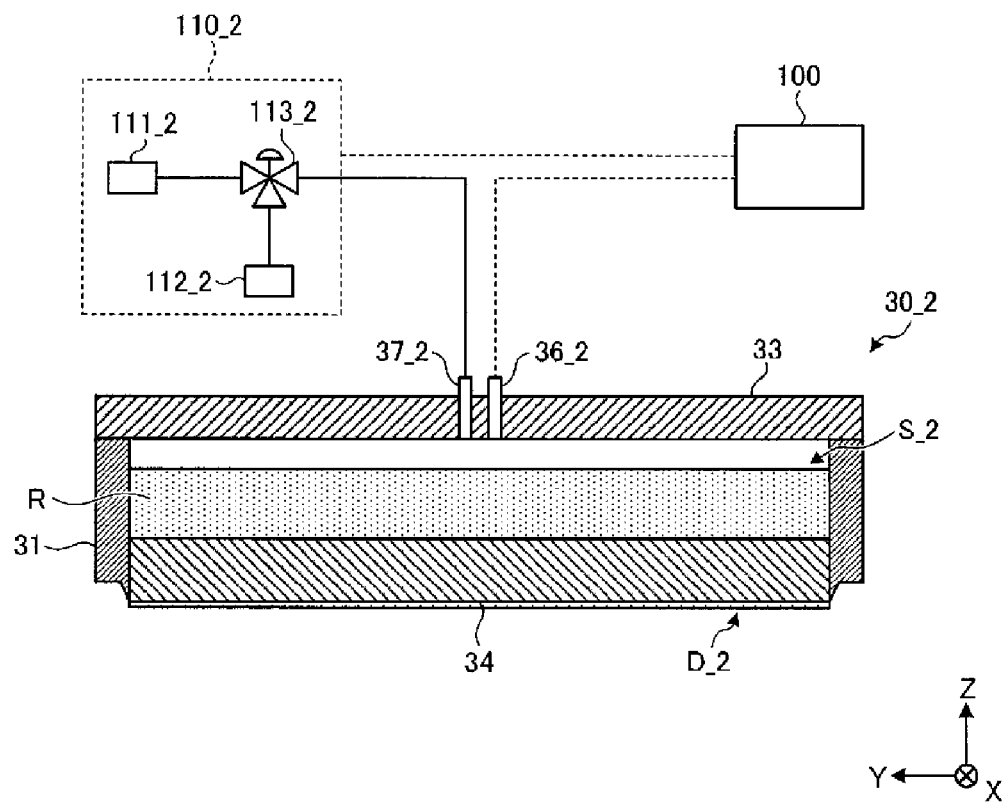
FIG. 16 is a schematic vertical cross-sectional view illustrating a configuration of a nozzle according to the third exemplary embodiment.
Figure 17:
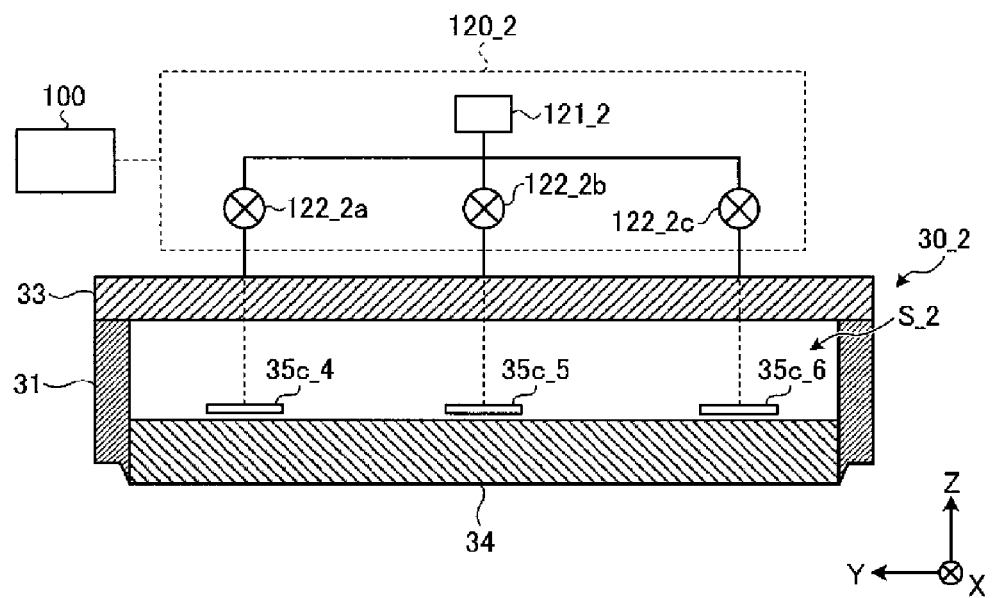
FIG. 17 is a schematic view illustrating a connection relation between an apparatus for a coating liquid filling processing and a nozzle according to the third exemplary embodiment.

However, in each exemplary embodiment as described above, there is exemplified a case where a nozzle is provided with partition plates, and a storage chamber is divided into a plurality of small chambers by the partition plates. However, the nozzle is not necessarily provided with the partition plates. Hereinafter, an example of a nozzle not provided with partition plates will be described. FIG. 16 is a schematic vertical cross-sectional view illustrating a configuration of a nozzle according to the third exemplary embodiment. FIG. 17 is a schematic view illustrating a connection relation between an apparatus for a coating liquid filling processing and a nozzle according to the third exemplary embodiment.

As illustrated in FIG. 16, unlike the nozzles 30, 30_1 as described above, a nozzle 30_2 according to the third exemplary embodiment is not provided with partition plates 38a, 38b. That is, a storage chamber S_2 provided in the nozzle 30_2 is not portioned into a plurality of small chambers.

A cover 33 of the nozzle 30_2 is installed with one pressure measuring unit 36_2 and one pressure adjusting tube 37_2 which penetrate the cover 33, respectively. The pressure measuring unit 36_2 and the pressure adjusting tube 37_2 are installed at an approximately central portion of the cover 33.

The pressure measuring unit 36_2 is electrically connected to a control device 100, and measures the pressure inside a storage chamber S-2 to input the measurement result to a control device 100.

The pressure adjusting tube 37_2 is connected to a pressure adjusting unit 110_2 that adjusts the pressure inside the storage chamber S_2. The pressure adjusting unit 110_2 is provided with an exhausting unit 111_2, a gas supply source 112_2 and a conversion valve 113_2. The pressure adjusting unit 110_2 has the same configuration as that of the pressure adjusting units 110a to 110c as described above, and the description thereof will be omitted here.

The nozzle 30_2 according to the third exemplary embodiment is constituted as described above, and performs the same pressure control as the nozzle 30 according to the first exemplary embodiment in the coating liquid filling processing. That is, the pressure adjusting unit 110_2 is controlled by the control device 110 such that the pressure inside the storage chamber S_2 of the nozzle 30_2 is slowly decreased during the coating liquid filling processing. By doing this, the coating liquid R is suppressed from being leaked from a discharge port D_2 during the coating liquid filling processing.

Further, as illustrated in FIG. 17, the nozzle 30_2 according to the third exemplary embodiment is formed with liquid supply ports 35c_4, 35c_5, 35c_6. The liquid supply ports 35c_4, 35c_5, 35c_6 have a slit shape extending in the longitudinal direction of the nozzle 30_2. The liquid supply port 35c_4 and the liquid supply port 35c_5 are installed at both ends in the longitudinal direction of the nozzle 30_2, respectively, and the liquid supply port 35c_5 is installed at the central portion in the longitudinal direction of the nozzle 30_2. As such, the liquid supply ports 35c_4, 35c_5, 35c_6 are disposed along the longitudinal direction of the nozzle 30_2.

Further, the liquid supply ports 35c_4, 35c_5, 35c_6 are connected to a coating liquid supplying unit 120_2. The coating liquid supplying unit 120_2 is provided with a coating liquid supply source 121_2 and valves 122_2a to 122_2c. As illustrated in FIG. 17, the liquid supply ports 35c_4 to 35c_6 are connected to the coating liquid supply source 121_2 through the valves 122_2a to 122_2c, respectively. Further, the coating liquid supplying unit 120_2 is electrically connected to the control device 100, and the opening/closing of the valves 122_2a to 122_2c are controlled by the control device 100.

The control device 100 can rapidly flatten the liquid surface of the coating liquid R filled in the storage chamber S-2 by individually controlling the opening/closing of the valves 122_2a to 122_2c.

Specifically, the control device 100 detects the height of the liquid surface in the storage chamber S-2 by using a liquid surface detecting unit 160 during the coating liquid filling processing, and controls the degree of opening or the opening/closing time of the valves 122_2a to 122_2c depending on the detection result.

For example, when the liquid surface of the coating liquid R at the central portion in the longitudinal direction of the storage chamber S_2 is lower than the liquid surface at the end in the longitudinal direction, the control device 100 increases the degree of opening of the valve 122_2b or extends the opening time, compared to the valves 122_2a, 122_2c. By doing this, the coating liquid R is supplied more from liquid supply port 35c_5 disposed at the central portion in the longitudinal direction of the nozzle 30_2, thereby solving leaning of the liquid surface.

As described above, even in a case where leaning occurs on the liquid surface of the coating liquid R during the coating liquid filling processing, the control device 100 can solve the leaning promptly to flatten the liquid surface by individually controlling the valves 122_2a to 122_2c depending on the detection result of the liquid surface detecting unit 160.

Further, although there is exemplified herein a case where the nozzle 30_2 is formed with three liquid supply ports 35c_4 to 35c_6, the number of the liquid supply ports formed in the nozzle may be four or more. In this case, a coating liquid supplying unit may be provided with the number of valves according to the number of liquid supply ports formed in the nozzle. Further, the nozzle may be provided with only one liquid supply port. In this case, a plurality of valves may be connected to one liquid supply port along the longitudinal direction of the nozzle.

Further, although there is exemplified herein a case where the coating liquid supplying unit 120_2 is connected directly to the liquid supply ports 35c_4, 35c_5, 35c_6, an intermediate tank may be interposed therebetween.

(Fourth Exemplary Embodiment)

Figure 18:
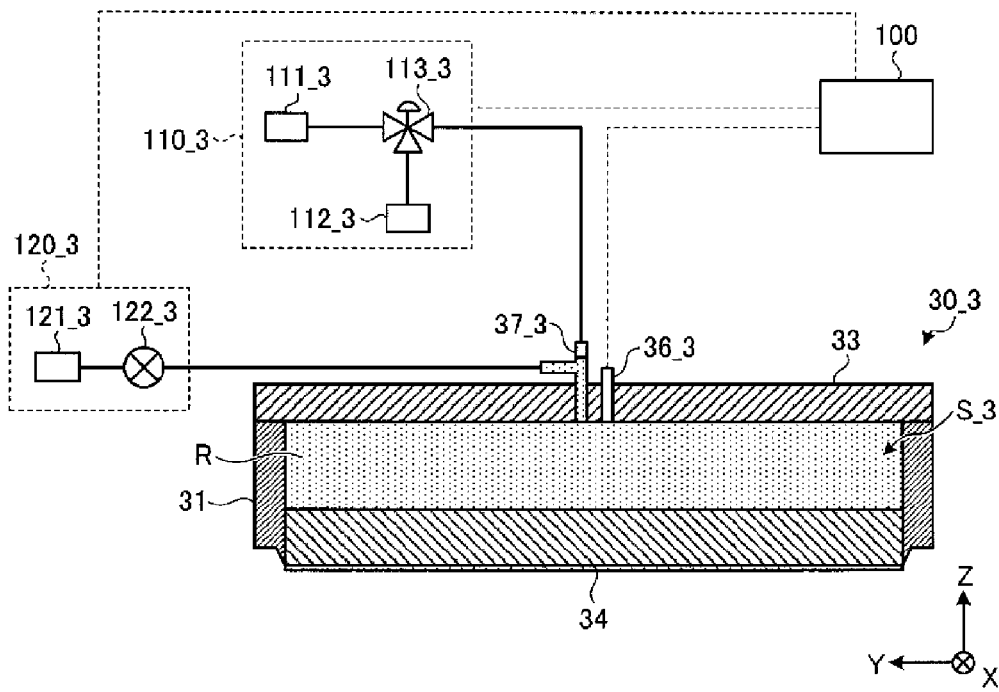
FIG. 18 is a schematic view illustrating a connection relation between an apparatus for a coating liquid filling processing and a nozzle according to the fourth exemplary embodiment.
Figure 19:
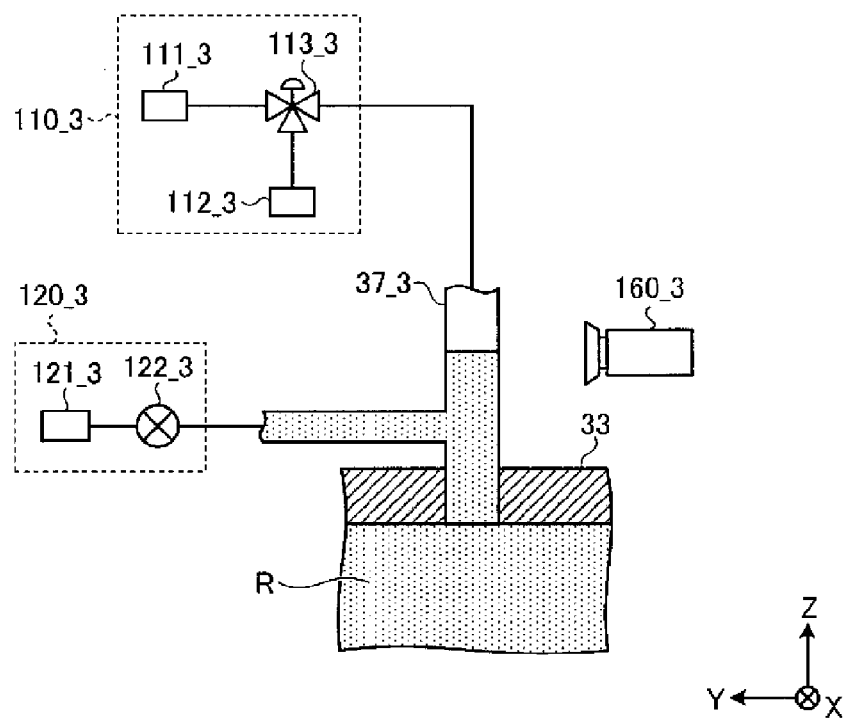
FIG. 19 is a schematic enlarged view of the periphery of the pressure adjusting tube in FIG. 18.

The method for controlling pressure in a storage chamber and the method for filling a coating liquid are not limited to the methods as described in the first to third exemplary embodiments. Hereinafter, another example of the method for controlling pressure in a storage chamber and the method for filling a coating liquid will be described in reference with FIG. 18 and FIG. 19. FIG. 18 is a schematic view illustrating a connection relation between an apparatus for a coating liquid filling processing and a nozzle according to the fourth exemplary embodiment. FIG. 19 is a schematic enlarged view of the periphery of the pressure adjusting tube in FIG. 18.

As illustrated in FIG. 18, like the nozzle 30_2 according to the third exemplary embodiment, a nozzle 30_3 according to the fourth exemplary embodiment is not provided with partition plates 38a, 38b. That is, the storage chamber S_3 provided in the nozzle 30_3 is not partitioned into a plurality of small chambers.

Further, the storage chamber S_3 is fully charged with a coating liquid R. That is, the inside of the nozzle 30_1 is filled with the coating liquid R.

A cover 33 of the nozzle 30_3 is installed with one pressure measuring unit 36_3 and one pressure adjusting tube 37_3 which penetrate the cover 33, respectively. The pressure measuring unit 36_3 and the pressure adjusting tube 37_3 are installed at an approximately central portion of the cover 33.

The pressure measuring unit 36_3 is electrically connected to a control device 100, and measures the pressure inside a storage chamber S-3 to input the measurement result to a control device 100.

The pressure adjusting tube 37_3 is connected to a pressure adjusting unit 110_3 that adjusts the pressure inside the storage chamber S_3. The pressure adjusting unit 110_3 is provided with an exhausting unit 111_3, a gas supply source 112_3 and a conversion valve 113_3. The configuration of the pressure adjusting unit 110_3 is the same as that of the pressure adjusting units 110a to 110c as described above, and the description thereof will be omitted here.

Further, the pressure adjusting tube 37_3 is also connected to a coating liquid supplying unit 120_3 that supplies a coating liquid R to the storage chamber S_3. The coating liquid supplying unit 120_3 is provided with the coating liquid supply source 121_3 and a valve 122_3. The configuration of the coating liquid supplying unit 120_3 is the same as that of the coating liquid supplying unit 120 as described above, and the description thereof will be omitted here.

In the fourth exemplary embodiment, the coating liquid R is supplied from the coating liquid supply source 121_3 of the coating liquid supplying unit 120_3 through the pressure adjusting tube 37_3 to the storage chamber S_3. As such, the pressure adjusting tube 37_3 according to the fourth exemplary embodiment also functions as a liquid supplying tube.

As illustrated in FIG. 19, the pressure adjusting tube 37_3 is filled with the coating liquid R to some degree. Specifically, it is preferable that the coating liquid R is filled up to the position higher than the bifurcation point to the coating liquid supplying unit 120_3. Further, it is preferable that the pressure adjusting tube 37_3 is filled with an amount of the coating liquid R capable of coating the coating liquid R on the substrate W at least once.

Further, the pressure adjusting tube 37_3 is formed as a transparent member such that the coating liquid R inside the pressure adjusting tube 37_3 is viewable from the outside.

In the fourth exemplary embodiment, the liquid surface detecting unit 160_3 detects the height of the liquid surface of the coating liquid R in the pressure adjusting tube 37_3. Then, according to the detection result, that is, according to the height of the liquid surface of the coating liquid R in the pressure adjusting tube 37_3, the control device 100 controls the pressure adjusting unit 110_3 such that the discharge rate becomes constant to adjust the pressure inside the storage chamber S_3.

In the fourth exemplary embodiment, since the height of the liquid surface in the pressure adjusting tube 37_3 is detected, the detection range by the liquid surface detecting unit 160_3 may be small as compared with the case of detecting the height of the liquid surface in the storage chamber S_3. Therefore, according to the fourth exemplary embodiment, it is possible to ease the monitoring of the liquid surface.

Further, in the fourth exemplary embodiment, since the inside of the storage chamber S_3 is filled with the coating liquid R, there is no concern that leaning of the coating liquid R occurs in the storage chamber S_3. Accordingly, during or after the coating liquid filling processing, there is no need to wait until leaning of the coating liquid charged in the storage chamber S_3 disappears.

Further, although there is exemplified herein a case where the coating liquid supplying unit 120_3 is connected directly to the pressure adjusting tube 37_3, an intermediate tank may be interposed between the pressure adjusting tube 37_3 and the coating liquid supplying unit 120_3.

Further, in each exemplary embodiment as described above, there is exemplified a case where the coating liquid is coated on the upper surface of the substrate by moving the substrate in the horizontal direction, but not limited thereto. The coating liquid may be coated on the upper surface of the substrate by moving the nozzle in the horizontal direction.

Further, in each exemplary embodiment, there is exemplified a case where the coating apparatus is provided with one nozzle (see FIG. 1). However, the coating apparatus may be provided with a plurality of sets of nozzles and elevation mechanisms along the moving direction of the substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A coating apparatus comprising:
    a nozzle provided with a storage chamber that stores a coating liquid and a slit-like flow path that is in communication with the storage chamber, and configured to discharge the coating liquid from a discharge port formed at a front end of the flow path;
    a moving mechanism configured to move the nozzle and a substrate relatively to each other along a surface of the substrate;
    a pressure adjusting unit configured to adjust pressure inside the storage chamber; and
    a pressure control unit configured to control the pressure adjusting unit so as to adjust pressure inside the storage chamber, such that:
    the storage chamber attains a first negative pressure,
    then while the coating liquid fills the storage chamber, the pressure inside the storage chamber is gradually lowered from the first negative pressure to a second negative pressure that has an absolute value greater than the absolute value of the first negative pressure,
    then while the nozzle moves from one end of the substrate to another end of the substrate while discharging the coating liquid on the substrate, the pressure inside the storage chamber is gradually raised from the second negative pressure to a third negative pressure that has an absolute value less than the absolute value of the second negative pressure but greater than the absolute value of the first negative pressure, and then while the nozzle is descending toward the substrate while continuing to discharge the coating liquid on the substrate, the negative pressure inside the storage chamber is gradually raised from the third negative pressure to the first negative pressure.

2. The coating apparatus of claim 1, further comprising a contact member extending in the longitudinal direction of the discharge port, wherein the pressure control unit fills the coating liquid in a state where the discharge port of the nozzle is brought into contact with the contact member.

3. The coating apparatus of claim 1, wherein the nozzle is in communication with the inside of the storage chamber and the outside of the storage chamber, and is provided with a liquid supply port that supplies the coating liquid supplied from the outside to the inside of the storage chamber, and the liquid supply port has a slit shape extending in the longitudinal direction of the flow path.

4. The coating apparatus of claim 3, wherein the liquid supply port is disposed in the vicinity of the boundary portion between the storage chamber and the flow path.

5. The coating apparatus of claim 1, wherein the pressure control unit maintains the pressure inside the storage chamber at the time when the filling of the coating liquid in the inside of the storage chamber is completed, until the coating of the coating liquid is started.

6. The coating apparatus of claim 1, wherein the pressure control unit controls the pressure adjusting unit such that the discharge rate becomes constant during the coating of the coating liquid on the substrate to adjust the pressure inside the storage chamber.

7. The coating apparatus of claim 1, further comprising:

a liquid surface detecting unit configured to detect the liquid surface of the coating liquid stored in the storage chamber.

8. The coating apparatus of claim 7, further comprising:

a coating processing control unit configured to determine whether or not the liquid surface is flat, based on the result detected by the liquid surface detecting unit, and when it is determined that the liquid surface is flat, start the coating processing with the nozzle.

9. The coating apparatus of claim 7, wherein a part of the storage chamber is formed by a transparent member, and the liquid surface detecting unit detects the liquid surface through the transparent member from the outside of the nozzle.

10. The coating apparatus of claim 9, further comprising a prism that reflects or refracts light, wherein the liquid surface detecting unit is disposed to be inclined at a predetermined angle with respect to the liquid surface, and picks up an image of the liquid surface viewed from the direction parallel to the liquid surface.

* * * * *